(12) United States Patent
Dahl et al.

(10) Patent No.: US 6,857,116 B1
(45) Date of Patent: Feb. 15, 2005

(54) OPTIMIZATION OF ABUTTED-PIN HIERARCHICAL PHYSICAL DESIGN

(75) Inventors: Peter Dahl, Cupertino, CA (US);
Byron Dickinson, San Jose, CA (US);
Margie Levine, Menlo Park, CA (US);
Paul Rodman, Palo Alto, CA (US)

(73) Assignee: Reshape, Inc., Mountain View, CA (US)

( * ) Notice: Subject to any disclaimer, the term of this patent is extended or adjusted under 35 U.S.C. 154(b) by 0 days.

(21) Appl. No.: 09/714,722

(22) Filed: Nov. 15, 2000

(51) Int. Cl.[7] .............................................. G06F 17/50
(52) U.S. Cl. ............................. 716/12; 716/13; 716/14
(58) Field of Search ............................ 716/2, 4, 7, 8, 716/9, 11, 12, 13, 14

(56) References Cited

U.S. PATENT DOCUMENTS

| | | | |
|---|---|---|---|
| 4,890,238 A | 12/1989 | Klein et al. | 364/491 |
| 5,187,671 A | 2/1993 | Cobb | 364/490 |
| 5,309,370 A | 5/1994 | Wong | 364/490 |
| 5,533,148 A | 7/1996 | Sayah et al. | 382/240 |
| 5,544,088 A | 8/1996 | Aubertine et al. | 364/489 |
| 5,576,969 A | 11/1996 | Aoki et al. | 364/491 |
| 5,757,658 A | 5/1998 | Rodman et al. | 364/491 |
| 6,243,854 B1 | 6/2001 | Lavin et al. | 716/19 |
| 6,425,113 B1 * | 7/2002 | Anderson et al. | 716/5 |
| 6,618,849 B2 | 9/2003 | Teig et al. | 716/12 |

FOREIGN PATENT DOCUMENTS

WO    WO00/67163    11/2000 ............ G06F/17/50

* cited by examiner

*Primary Examiner*—Thien F Tran
(74) *Attorney, Agent, or Firm*—Wagner, Murabito, & Hao LLP

(57) ABSTRACT

An abutted-pin hierarchical physical design process is described. The abutted-pin hierarchical physical design provides solutions to the problems of the traditional hierarchical physical design and provides additional advantages and benefits. In particular, the abutted-pin hierarchical physical design does not have channels. Moreover, in the abutted-pin hierarchical physical design, components of the top-level are merged into the block-level so that the top-level netlist is reduced significantly.

52 Claims, 31 Drawing Sheets

OPTIMIZATION OF ABUTTED-PIN HIERARCHICAL PHYSICAL DESIGN

BACKGROUND OF THE INVENTION

1. Field of the Invention

The present invention generally relates to the field of integrated circuit design. More particularly, the present invention relates to the field of software tools for hierarchical physical design.

2. Related Art

The tremendous advances in technology have been fueled by improvements in integrated circuit design. In particular, integrated circuits have become smaller and more complex. Integrated circuit design engineers depend on electronic design automation (EDA) software tools to facilitate the design of integrated circuits.

Typically, the integrated circuit design process begins with a specification which describes the functionality of the integrated circuit and may include a variety of constraints. Then, during a logic design phase, the logical implementation of the integrated circuit is determined. Several operations are performed to obtain a logical representation of the integrated circuit. Generally, EDA software tools use register transfer logic (RTL) to represent the integrated circuit. However, additional EDA software tools may be used.

After completing the logic design phase, the integrated circuit undergoes a physical design phase. Typically, the output of the logic design phase, is a netlist, which is then used in the physical design phase. Here, EDA software tools layout the integrated circuit to obtain a representation of the physical components in the integrated circuit, whereas the representation indicates the manner in which the integrated circuit will be implemented on a semiconductor chip. A variety of operations are performed on the layout of the integrated circuit.

At the end of the physical design phase, the representation of the semiconductor chip (in which the integrated circuit is implemented) is sent to a semiconductor manufacturing plant.

Typically, in the physical design phase, EDA software tools implement a flat physical design. For example, the components (standard cells, macrocells, etc.) of the integrated circuit are placed during a placement operation and are routed during a routing operation. However, as the integrated circuit becomes more complex, the EDA software tools struggle to perform the placement operation and the routing operation. In particular, the performance of the EDA software tools degrades since the EDA software tools have to manipulate very large files during the placement operation and the routing operation. Moreover, as the complexity of the integrated circuit increases, the time necessary to complete the physical design phase increases significantly.

Traditional hierarchical physical design has emerged as an alternative to the flat physical design. FIG. 1 illustrates the traditional hierarchical physical design 100. Here, the components of the integrated circuit are partitioned into a plurality of blocks 10–30. Each block 10–30 includes a plurality of pins 50, whereas each pin 50 represents a location where a signal can enter the block 10–30 or a location where a signal can exit the block 10–30. As illustrated in FIG. 1, the traditional hierarchical physical design 100 includes a channel 40. The channel 40 provides space in order to connect the pins 50 of the blocks 10–30 to one another via metal (not shown) or any other wiring material. The traditional hierarchical physical design 100 enables the placement operation and the routing operation (as well as other operations) for the blocks 10–30 to be performed in parallel with EDA software tools, reducing the time period of the physical design phase. Moreover, the performance of the EDA software tools is improved because the file for each block 10–30 is much smaller than the file for the entire integrated circuit of the flat physical design. More importantly, the EDA software tools are better suited to optimize each block 10–30 than to optimize the entire integrated circuit of the flat physical design. However, the traditional hierarchical physical design 100 generates wasted space in the channel 40 and generates wiring problems in the channel 40, such as congestion and crosstalk. Moreover, the traditional hierarchical physical design 100 places and routes components at a top-level (shown in FIG. 1) and a block-level (within each block 10–30), causing inefficiencies and causing problems with EDA software tools which are configured to operate with flat physical designs.

SUMMARY OF THE INVENTION

An abutted-pin hierarchical physical design process is described. The abutted-pin hierarchical physical design provides solutions to the problems of the traditional hierarchical physical design and provides additional advantages and benefits. In particular, the abutted-pin hierarchical physical design does not have channels. Moreover, in the abutted-pin hierarchical physical design, components of the top-level are merged into the block-level so that the top-level netlist is reduced significantly.

In the integrated circuit design flow according to an embodiment of the present invention, the physical design phase receives the netlist from the logic design phase. In addition, the physical design phase receives physical design information, whereas the physical design information can be any information about a prior integrated circuit that has undergone the physical design phase. In an embodiment, the physical design information is stored in a database.

In an embodiment of the present invention, the integrated circuit design flow of the present invention is utilized to optimize pin assignment. In an embodiment of the present invention, excess pins formed along a boundary between two blocks are removed.

In an embodiment of the present invention, a software tool that performs a "press" operation preserves the properties associated with a segment of a top-level shape despite the shape operation (e.g., AND) being performed with the block and the top-level shape to obtain the segment.

If the top-level object has the press property, the top-level object retains its location when the top-level object is "pressed" into a block. If the top-level object does not have the press property, the top-level object generally does not retain its location when the top-level object is "pressed" into the block.

If in the top-level netlist, the instantiation of a block includes a port that is unused, (thus, not needed for the top-level routing for pin assignment), a software tool removes the port from the top-level netlist, but the block-level netlist of the block remains unchanged.

Some software tools are not able to represent the relationship that more than one port is coupled to a pin. Hence, a software tool removes one of the ports from the netlist based on some criteria, such as whether a port is an input port or an output port.

If in the top-level netlist, the instantiation of the block includes a port that is tied to either the power line (1) or the ground line (0) rather to a port of another block, a software tool removes the port from the top-level netlist to avoid routing the port at the top-level. Moreover, the software tool ties the port to either the power line (1) or the ground line (0) in the block-level netlist of the block.

In an embodiment, a software tool performs an unwinding operation which adds to the block-level netlist—of bonding pad blocks—the ports (which were removed earlier by the software tool) that couple to the top-level inputs and to the top-level outputs. Thus, the netlist modified by the physical design phase (e.g., repeater and buffers are added to the netlist) can be compared with the netlist originally received from the logic design phase. In particular, formal verification, layout versus schematic (LVS) verification, and design rules check (DRC) verification can be performed by software tools.

In an embodiment, each block-level netlist is partitioned into a first netlist and a second netlist. The second netlist and its associated extraction file of each block and the top-level netlist and its associated extraction file are utilized by software tools to perform the timing analysis. This timing analysis can be performed significantly faster than the case where the block-level netlist is not partitioned into the first netlist and the second netlist. In an embodiment, the timing graph resulting from the timing analysis can be analyzed to extract timing constraints (relating to the delay that can be generated by a block) for each block. Hence, if a block is optimized to meet its extracted timing constrains, the block is more likely to meet its timing parameter when the block interacts with the other blocks in the integrated circuit.

These and other advantages of the present invention will no doubt become apparent to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Figure 1:
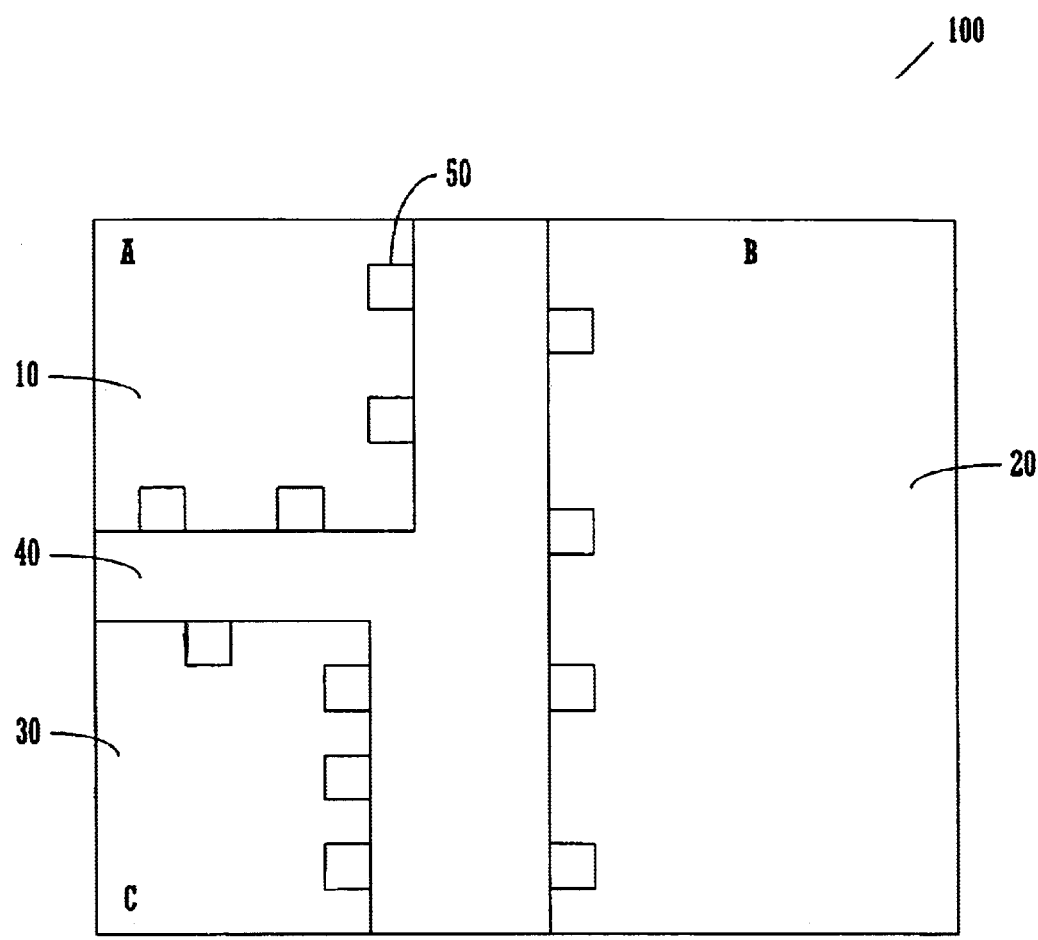
FIG. 1 illustrates the traditional hierarchical physical design 100.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proved convenient at times, principally for reasons of common usage, to refer to these signals a s bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, a variety of terms are discussed that refer to the actions and processes of an electronic system or a computer system, or other electronic computing device/system. The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical , mechanical, or quantum computers.

Exemplary Computer System Environment

Aspects of the present invention are discussed in terms of steps executed on a computer system. Although a variety of different computer systems can be used with the present invention, an exemplary computer system 200 is shown in FIG. 2.

Figure 2:
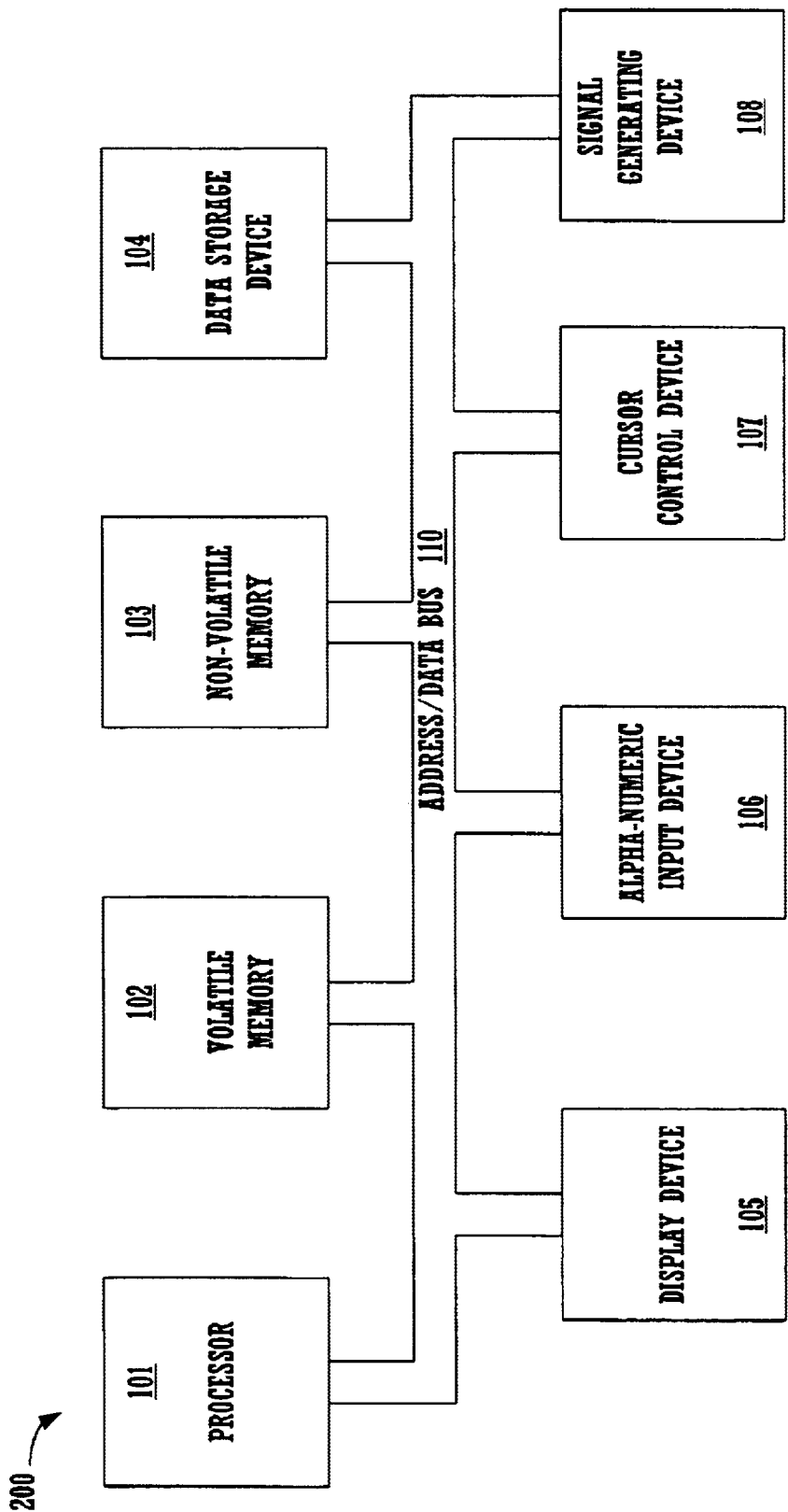
FIG. 2 illustrates an exemplary computer system 200 on which embodiments of the present invention may be practiced.

With reference to FIG. 2, portions of the present invention are comprised of computer-readable and computer executable instructions which reside, for example, in computer-usable media of an electronic system such as the exemplary computer system. FIG. 2 illustrates an exemplary computer system 200 on which embodiments of the present invention may be practiced. It is appreciated that the computer system 200 of FIG. 2 is exemplary only and that the present invention can operate within a number of different computer systems including general-purpose computer systems and embedded computer systems.

Computer system 200 includes an address/data bus 110 for communicating information, a central processor 101 coupled with bus 110 for processing information and instructions, a volatile memory 102. (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 200 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes) which are computer readable memories. Memory units of computer system 200 include volatile memory 102, non-volatile memory 103 and data storage device 104.

Exemplary computer system 200 can further include an optional signal generating device 108 (e.g., a network interface card "NIC") coupled to the bus 110 for interfacing with other computer systems. Also included in exemplary computer system 200 of FIG. 2 is an optional alphanumeric input device 106 including alphanumeric and function keys coupled to the bus 110 for communicating information and command selections to the central processor 101. Exemplary computer system 200 also includes an optional cursor control or directing device 107 coupled to the bus 110 for communicating user input information and command selections to the central processor 101. An optional display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor can be directed and/or activated via input from alphanumeric input device 106 using special keys and key sequence commands.

Abutted-pin Hierarchical Physical Design

Figure 3:
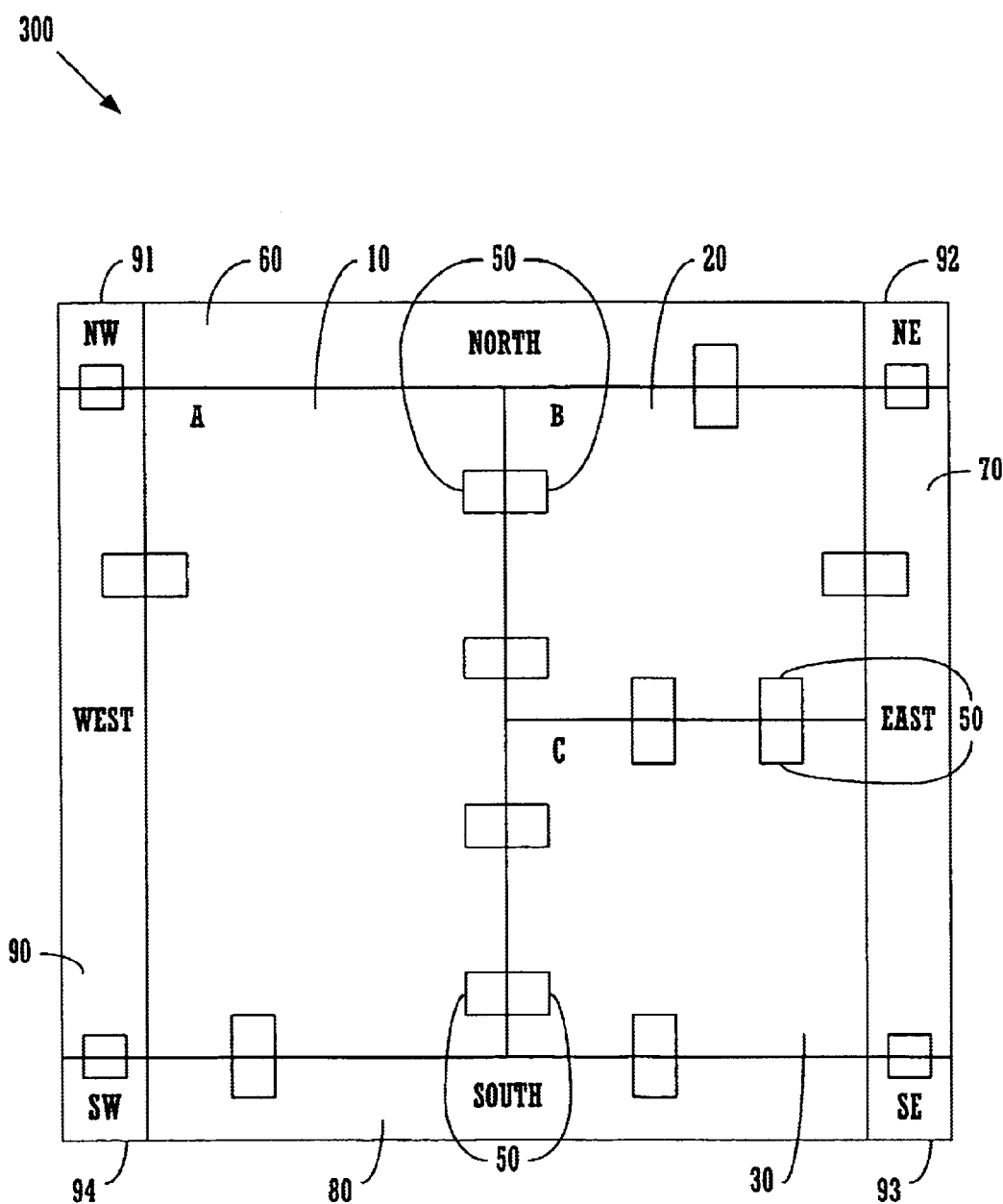
FIG. 3 illustrates an integrated circuit 300 generated with software tools according to an embodiment of the abutted-pin hierarchical physical design process of the present invention.

FIG. 3 illustrates an integrated circuit 300 generated with software tools according to the abutted-pin hierarchical physical design process of the present invention. The abutted-pin hierarchical physical design provides solutions The drawings referred to in this description should not be understood as being drawn to scale except if specifically noted.

to the problems of the traditional hierarchical physical design (see FIG. 1) and provides additional advantages and benefits. In particular, the abutted-pin hierarchical physical design does not have channels. Moreover, in the abutted-pin hierarchical physical design, components of the top-level are merged into the block-level so that the top-level netlist is reduced to instantiations of each block 10–30 and 60–94.

As illustrated in FIG. 3, the abutted-pin hierarchical physical design 300 includes a plurality of blocks 10–30 and 60–94. The netlist of the integrated circuit 300 is partitioned into the plurality of blocks 10–30 and 60–94 such that each block 10–30 and 60–94 has a block level netlist. Blocks 10–30 have the major or core components of the integrated circuit 300. Blocks 60–94 have the bonding pads and other support circuitry of the integrated circuit 300. The blocks 10–30 and 60–94 can be rectangular in shape and can be rectilinear in shape. It should be understood that the integrated circuit 300 can have any number of blocks.

Each block 10–30 and 60–94 has one or more pins 50, whereas each pin 50 represents a location where a signal can enter the block 10–30 and 60–94 or a location where a signal can exit the block 10–30 and 60–94. The edge or boundary of each block 10–30 and 60–94 rests against the edge or boundary of another block 10–30 and 60–94, such that the pin 50 of one block abuts the pin 50 of another block.

Moreover, the top-level components or objects (e.g., timing components, clock distribution wiring, power distribution wiring, repeaters, buffers, etc.) are not visible because they have been merged into the blocks 10–30 and 60–94 by a "press" operation performed by a software tool. First, the top-level objects (e.g., timing components, clock distribution wiring, power distribution wiring, repeaters, buffers, etc.) are placed and routed at the top-level (the top-level is shown in FIG. 3). In the "press" operation, the top-level objects (e.g., timing components, clock distribution wiring, power distribution wiring, repeaters, buffers, etc.) that are within the boundary of a block 10–30 and 60–94 are removed from the top-level netlist and merged into the block-level netlist of that block 10–30 and 60–94. Hence, the abutted-pin hierarchical physical design 300 can be optimized by separately optimizing the individual blocks 10–30 and 60–94. Thus, the software tools can generate (e.g., perform placement, routing, timing, verification, etc.) and optimize the individual blocks 10–30 and 60–94 in parallel. Moreover, a bug within an individual block 10–30 and 60–94 can be corrected by returning that individual block to the logic design phase, while the other blocks continue to undergo the physical design phase.

Figure 4:
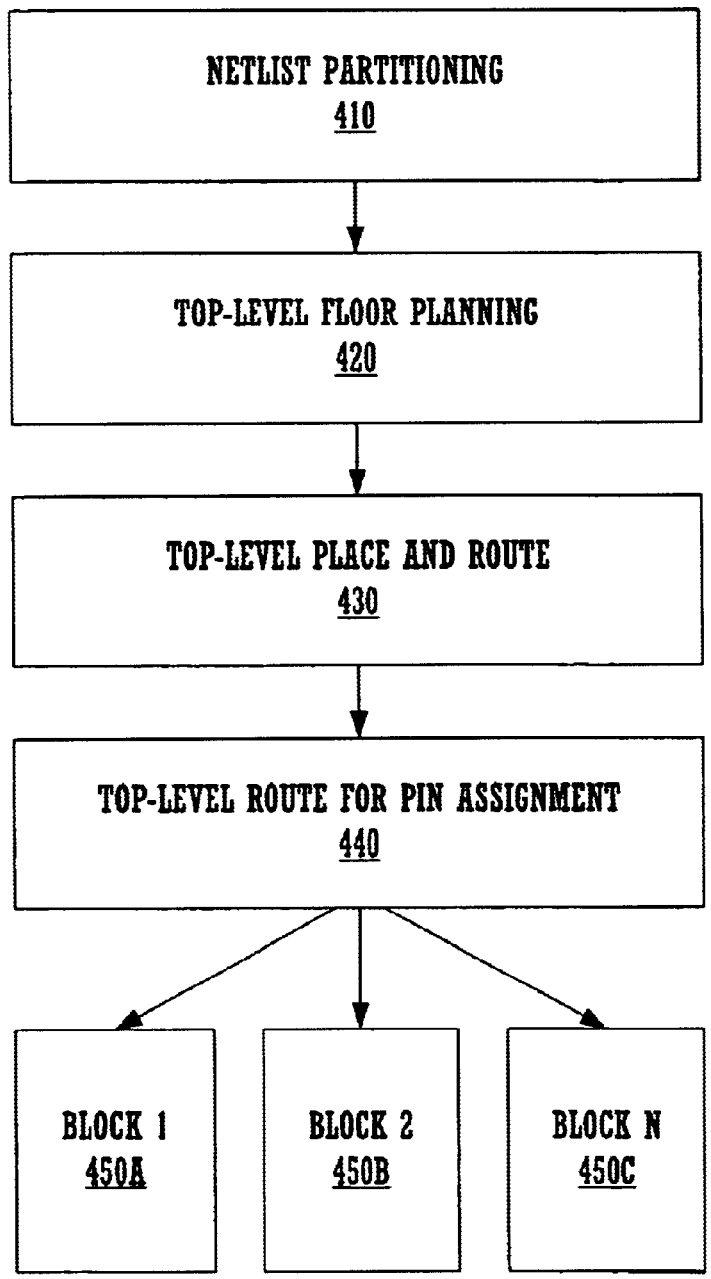
FIG. 4 illustrates the abutted-pin hierarchical physical design process 400 according to an embodiment of the present invention.

FIG. 4 illustrates the abutted-pin hierarchical physical design process 400 according to an embodiment of the present invention. At 410, a software tool receives the netlist of the integrated circuit from the logic design phase, as described above. The netlist is partitioned into a plurality of blocks, each block having a block-level netlist. In an embodiment, the partitioning of the netlist focuses on reducing the number of ports or terminals of a block that need to couple to the ports or terminals of other blocks.

Figure 6:
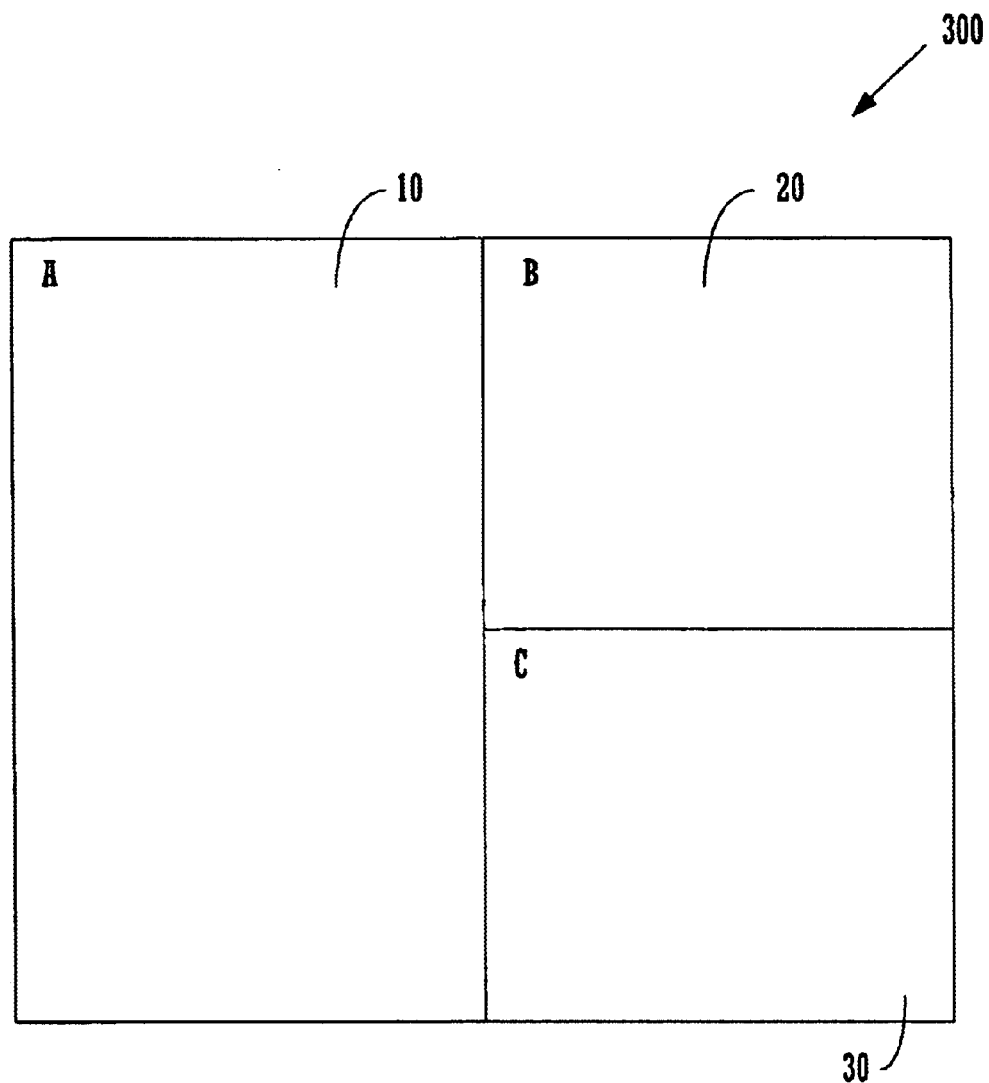
FIG. 6 illustrates the layout of the blocks 10–30 is established.

At 420, a software tool performs top-level floor planning. Here, the layout of each block is determined. At the end of the top-level floor planning, the top-level for an integrated circuit 300 (as shown in FIG. 6) is generated. As illustrated in FIG. 6, the layout of the blocks 10–30 is established. In FIG. 6, the bonding pads 60–94 (of FIG. 3) have been omitted.

Figure 7:
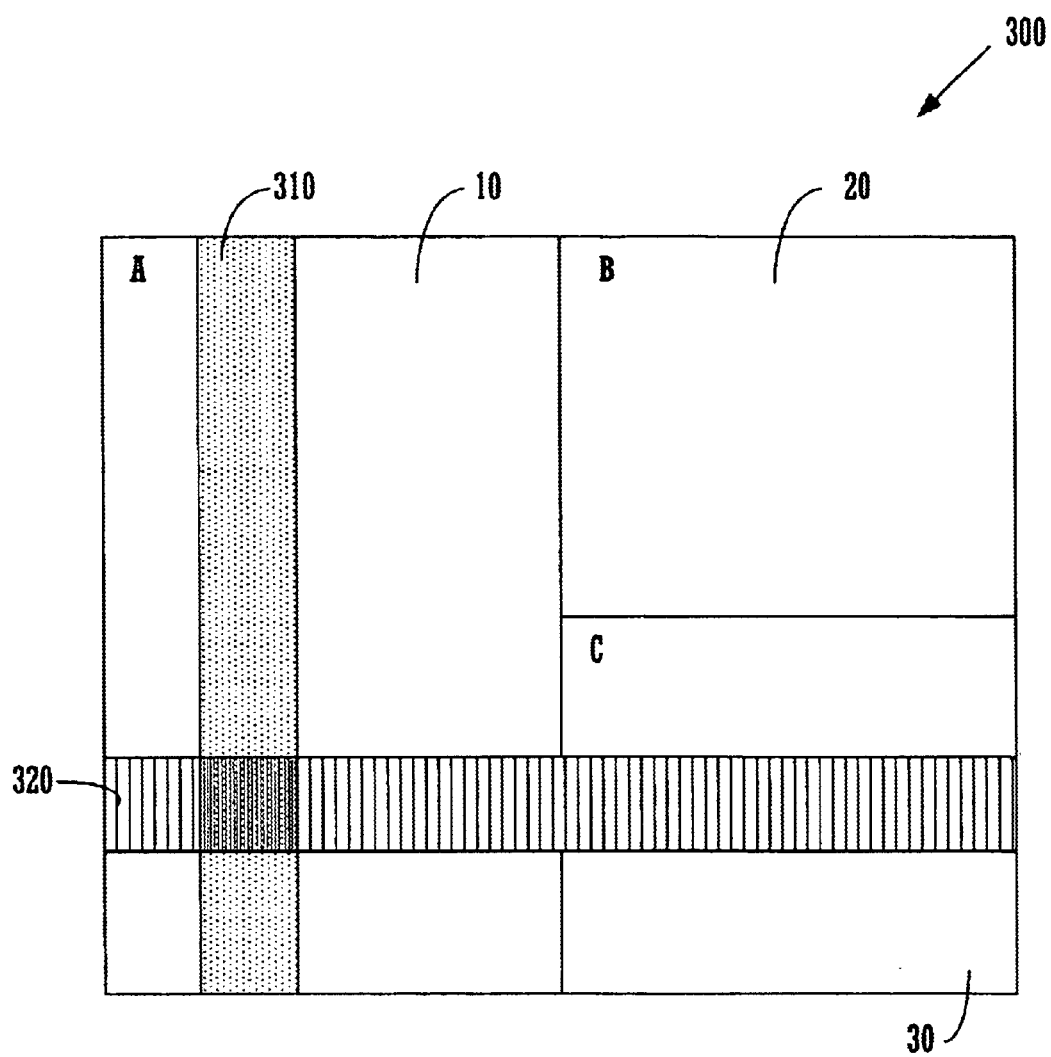
FIG. 7 illustrates a clock wire 320 and a power wire 310 of the top-level.

At 430, software tools perform top-level placement and routing for the top-level objects (e.g., timing components, clock distribution wiring, power distribution wiring, repeaters, buffers, etc.). FIG. 7 illustrates a clock wire 320 and a power wire 310 of the top-level. The clock wire 320 is routed over BlockA 10 and BlockC 30. The power wire 310 is routed over BlockA 10. It should be understood that any number of additional top-level objects can be placed and routed at the top-level.

Figure 8:
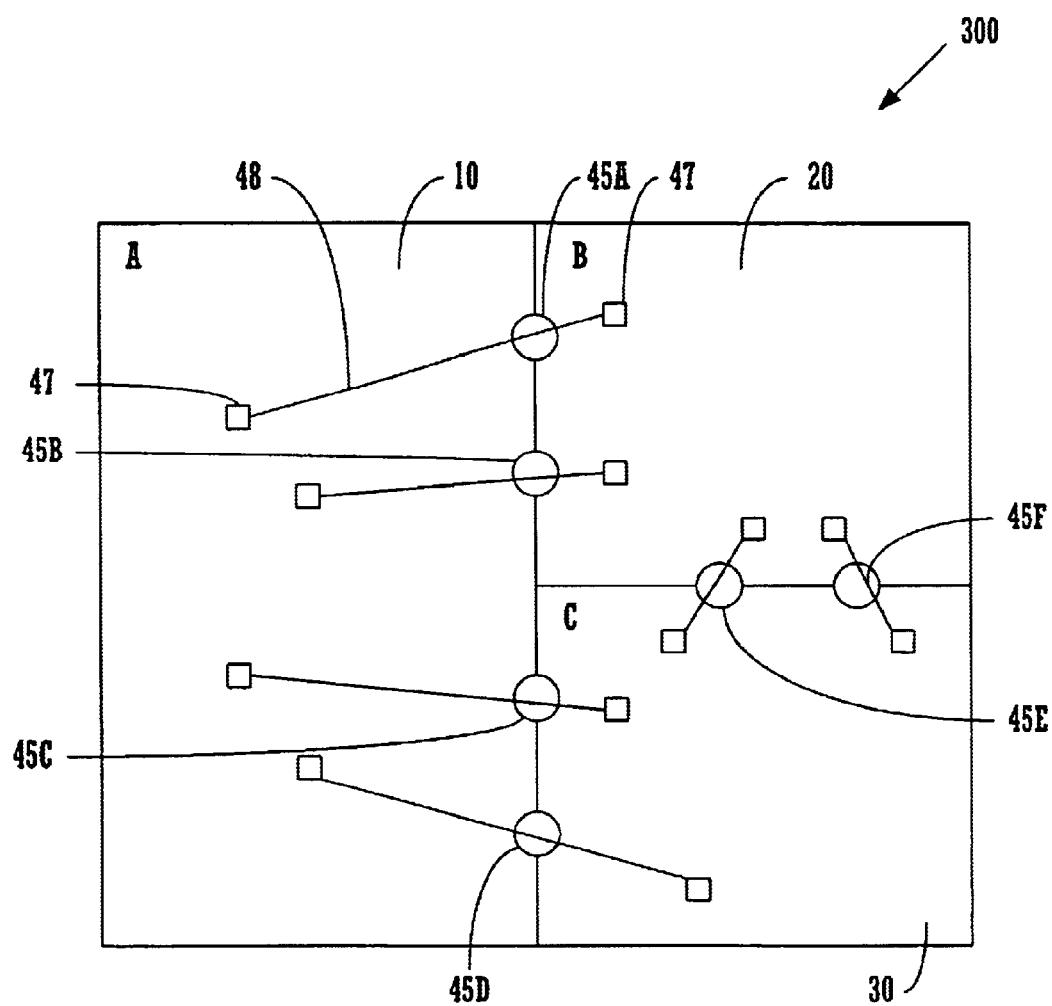
FIG. 8 illustrates a top-level route for obtaining the pin assignments for each block 10–30.

At 440, a software tool performs a top-level route for obtaining the pin assignments for each block 10–30, as illustrated in FIG. 8. Since each block 10–30 has one or more ports or terminals 47 that needs to couple to a port or terminal of another block 10–30, the pins for each block 10–30 have to be defined. Initially, the ports 47 of each block 10–30 are placed in a general random location within each block at the top-level since the actual location of the port 47 is not known until a placement operation is performed at the block-level. As illustrated in FIG. 8, the location 45A–45F where a routing wire 48 crosses a boundary between two blocks is defined as a pin for each of the blocks 10–30, facilitating creation of pins that are abutted. In an embodiment, a software tool creates each pin to have a width that is equivalent to the width of the routing wire 48 at the boundary between the two blocks. The pins 50 are illustrated in FIG. 3.

At 450A–450C, the abutted-pin hierarchical physical design process 400 enables software tools to generate and to optimize each block 10–30 in parallel at the block-level.

Figure 5:
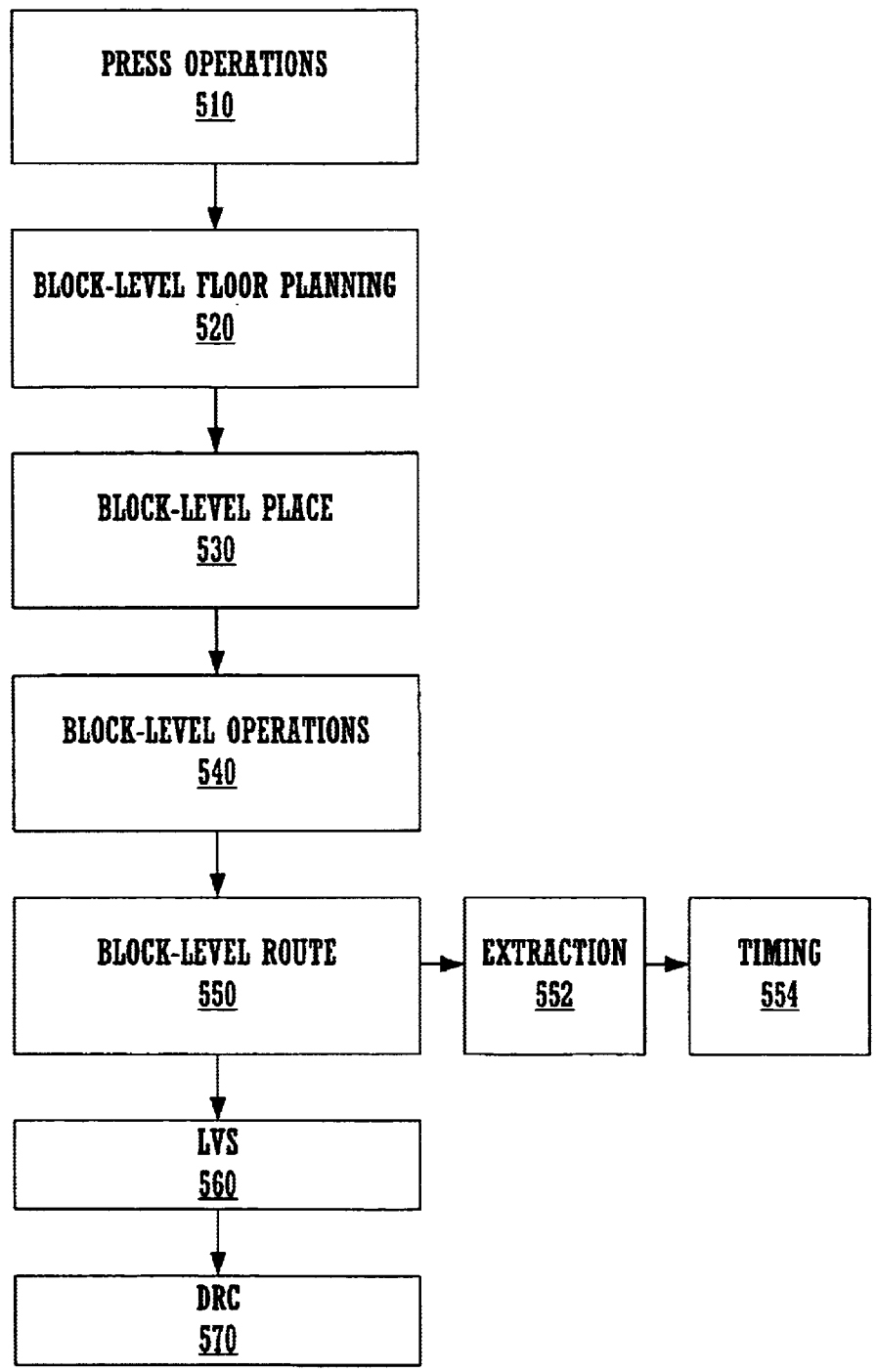
FIG. 5 illustrates the abutted-pin hierarchical physical design process 500 as performed at the block-level in a particular block (450A–450C of FIG. 4) after step 440 of FIG. 4.

FIG. 5 illustrates the abutted-pin hierarchical physical design process 500 as performed at the block-level in a particular block (450A–450C of FIG. 4) after step 440 of FIG. 4.

At 510, a software tool performs press operations. The top-level objects illustrated in FIG. 7 (e.g., a clock wire 320 and a power wire 310) and which are located within the boundary of a particular block, are pressed into the particular block. In particular, the top-level objects that are within the boundary of a particular block are removed from the top-level netlist and merged into the block-level netlist of that particular block. Moreover, the pins for the particular block are generated based on the location where the routing wire crosses the boundary between two blocks, as illustrated in FIG. 8 and FIG. 3.

At 520, a software tool performs block-level floor planning for the particular block. At 530, a software tool performs a block-level placement operation for the particular block. At 540, software tools perform a variety of block-level operations to optimize the particular block. Additionally, at 550, a block-level route is performed for the particular block by a software tool. At 552 and 554, software tools perform a block-level extraction operation for determining capacitance and resistance at the nodes and perform block-level timing analysis operations for the particular block.

At 560 and 570, a variety of software tools perform a number of verification operations such as formal verification, layout versus schematic (LVS) verification, and design rules check (DRC) verification.

Figure 9A:
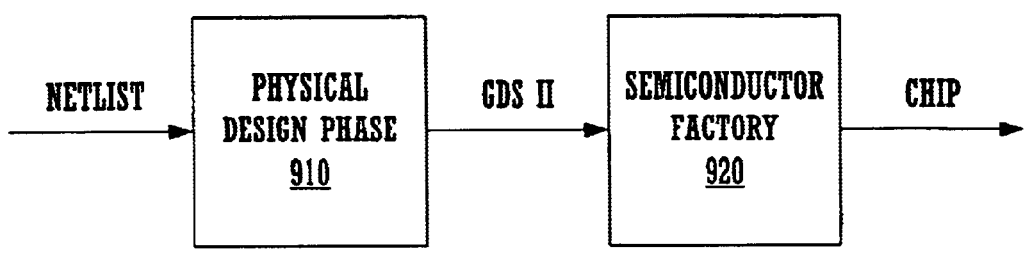
FIG. 9A illustrates the integrated circuit design flow of the prior art.

FIG. 9A illustrates the integrated circuit design flow of the prior art. As illustrated in FIG. 9A, the physical design phase 910 receives the netlist from the logic design phase (not shown). The physical design phase 910 generates the physical design for the integrated circuit and outputs a GDS II file. The GDS II file is received by the semiconductor factory 920. The integrated circuit is fabricated by the semiconductor factory 920 on a semiconductor chip.

Figure 9B:
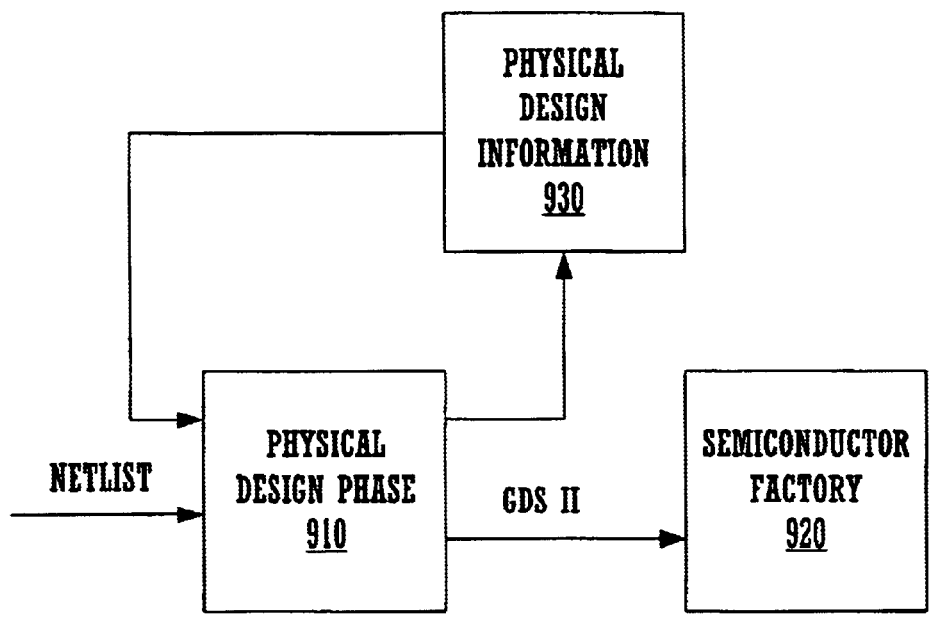
FIG. 9B illustrates the integrated circuit design flow according to an embodiment of the present invention.

FIG. 9B illustrates the integrated circuit design flow according to an embodiment of the present invention. As illustrated in FIG. 9B, the physical design phase 910 receives the netlist from the logic design phase (not shown). In addition, the physical design phase 910 receives physical design information 930, whereas the physical design information 930 can be any information about a prior integrated circuit that has undergone the physical design phase 910. In an embodiment, the physical design information 930 is stored in a database. For example, the physical design information 930 can be pin assignments of the prior integrated circuit, optimal clock distribution tree of the prior integrated circuit, parasitic extraction data of the prior integrated circuit, locations of obstructions such as a RAM of the prior integrated circuit, identification of congested blocks of the prior integrated circuit, metal resources for the blocks of the prior integrated circuit, or any other information which can facilitate optimizing the current integrated circuit. Thus, the software tools of the physical design phase 910 can customize the current integrated circuit to avoid the problems of the prior integrated circuit and to realize the benefits of the prior integrated circuit.

In the physical design phase 910, decisions made at the top-level with respect to the top-level objects, significantly influence the creation of problems at the block-level and the optimization operations at the block-level. By using physical design information 930 (concerning the block-level of the prior integrated circuit) at the top-level of the current integrated circuit, the decisions made at the top-level with respect to the top-level objects of the current integrated circuit will be able to reduce the problems present in the prior integrated circuit and will be able to generate solutions to overcome the problems present in the prior integrated circuit, improving the optimization of the abutted-pin hierarchical physical design process of the present invention. Thus, if the physical design information 930 has information about several prior integrated circuits, the current integrated circuit is more likely to be optimized.

In addition, the physical design phase 910 generates the physical design for the integrated circuit and outputs a GDS II file. Moreover, the physical design phase 910 stores physical design information 930 of the current integrated circuit to be used in the physical design phase 910 of a future integrated circuit. The GDS II file is received by the semiconductor factory 920. The integrated circuit is fabricated by the semiconductor factory 920 on a semiconductor chip.

Figure 10A:
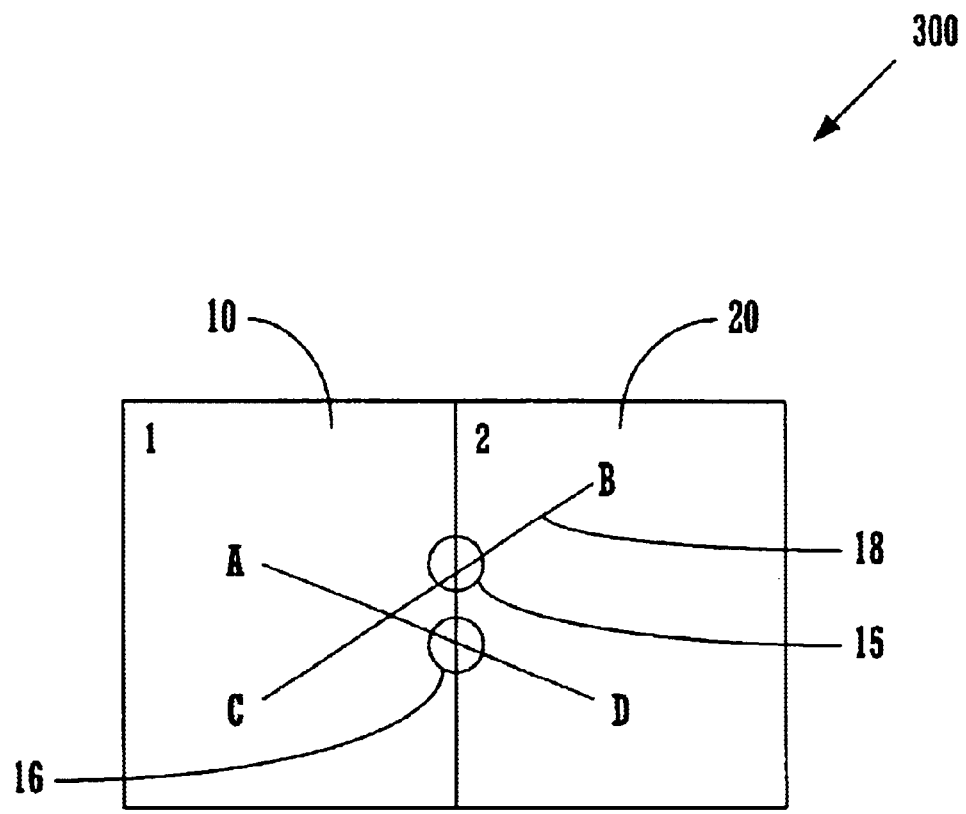
FIG. 10A illustrates an integrated circuit 300 based on the abutted-pin hierarchical physical design process of the present invention and using the integrated circuit design flow of the prior art (FIG. 9A), showing the top-level routing for pin assignment.

FIG. 10A illustrates an integrated circuit 300 based on the abutted-pin hierarchical physical design process of the present invention and using the integrated circuit design flow of the prior art (FIG. 9A), showing the top-level routing for pin assignment. The port C of block1 10 is routed to port B of block2 20. The port A of block1 10 is routed to port D of block2 20. This top-level routing has been performed after ports A–D where placed in a generally random location within each block 10–20 at the top-level since the actual locations of the ports A–D are not known until a placement operation is performed at the block-level. Here, the software tools at the top-level do not have access to the physical design information of a prior integrated circuit. The locations 15 and 16 are where the routing metal 18 crosses the boundary between two blocks 10 and 20.

Figure 10B:
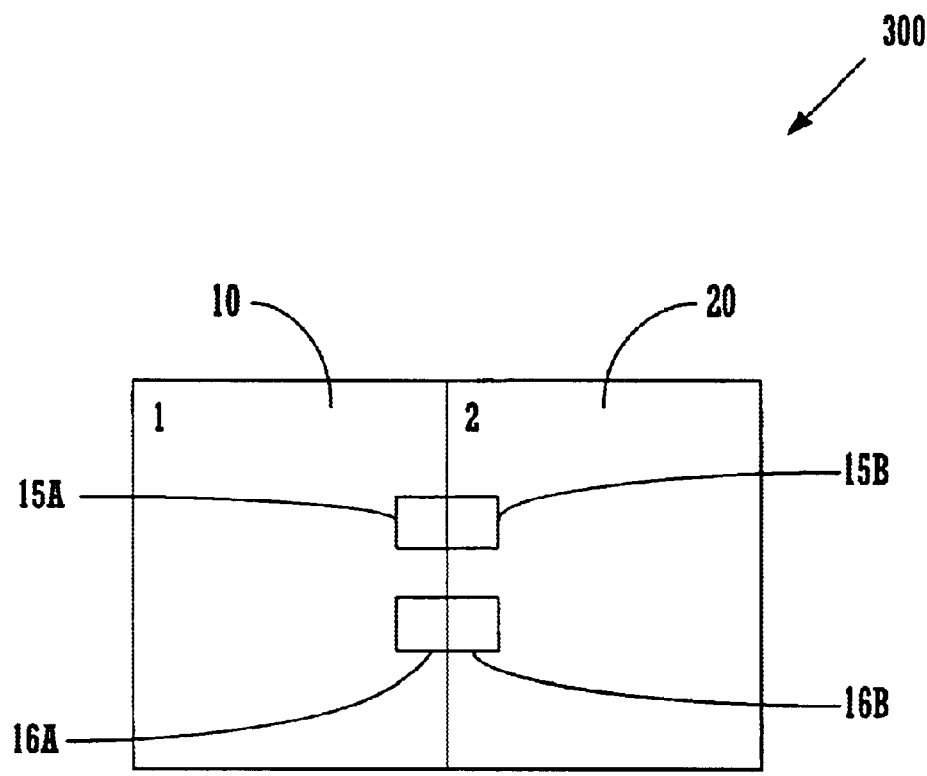
FIG. 10B illustrates the integrated circuit 300 of FIG. 10A at the block-level.

FIG. 10B illustrates the integrated circuit 300 of FIG. 10A. At the block-level, the pins 15A and 16A were formed for block1 10. At the block-level, the pins 15B and 16B were formed for block2 20, whereas pin 15A abuts pin 15B and pin 16A abuts pin 16B. The pins 15A and 15B were formed at location 15 of FIG. 10A. The pins 16A and 16B were formed at location 16 of FIG. 10A.

Figure 10C:
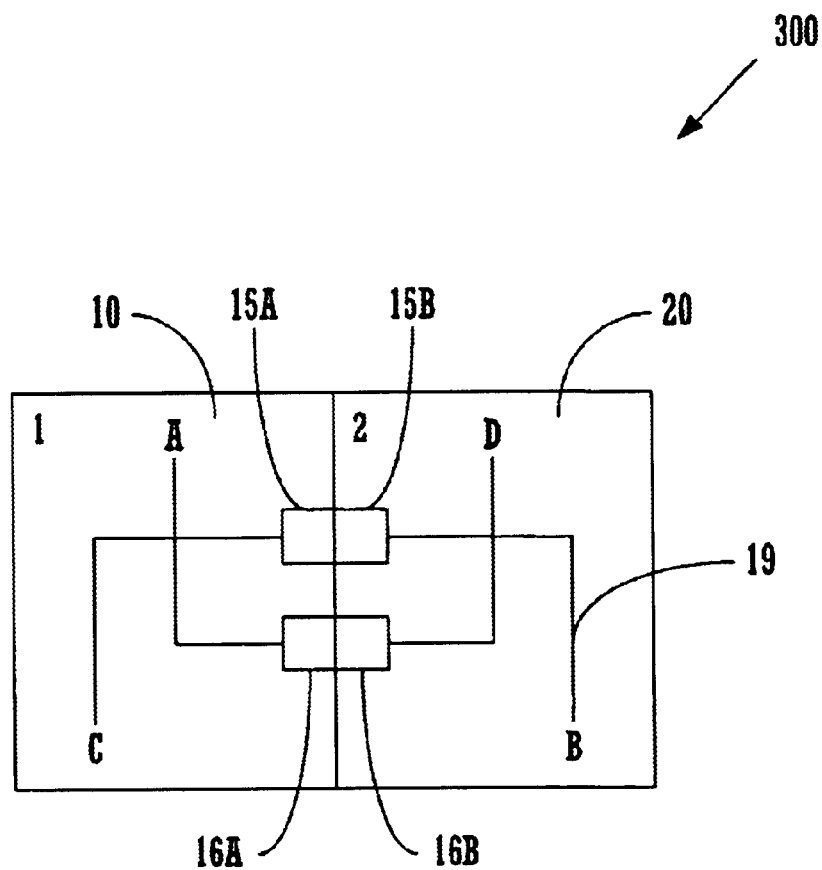
FIG. 10C illustrates the integrated circuit 300 of FIG. 10B at the block-level.

FIG. 10C illustrates the integrated circuit 300 of FIG. 10B at the block-level. As illustrated in FIG. 10C, the block-level placement operation for block1 10 placed the ports A and C at locations that are different from the locations used to generate the pin assignments in FIG. 10A. In addition, the block-level placement operation for block2 20 placed the ports B and D at locations that are different from the locations used to generate the pin assignments in FIG. 10A. Hence, the block-level routing operations for blocks 10 and 20 generated an inefficient amount of routing wire 19 to couple the ports to the pins in each block. In sum, the pin assignment affects the optimization of the routing wire 19.

Figure 11A:
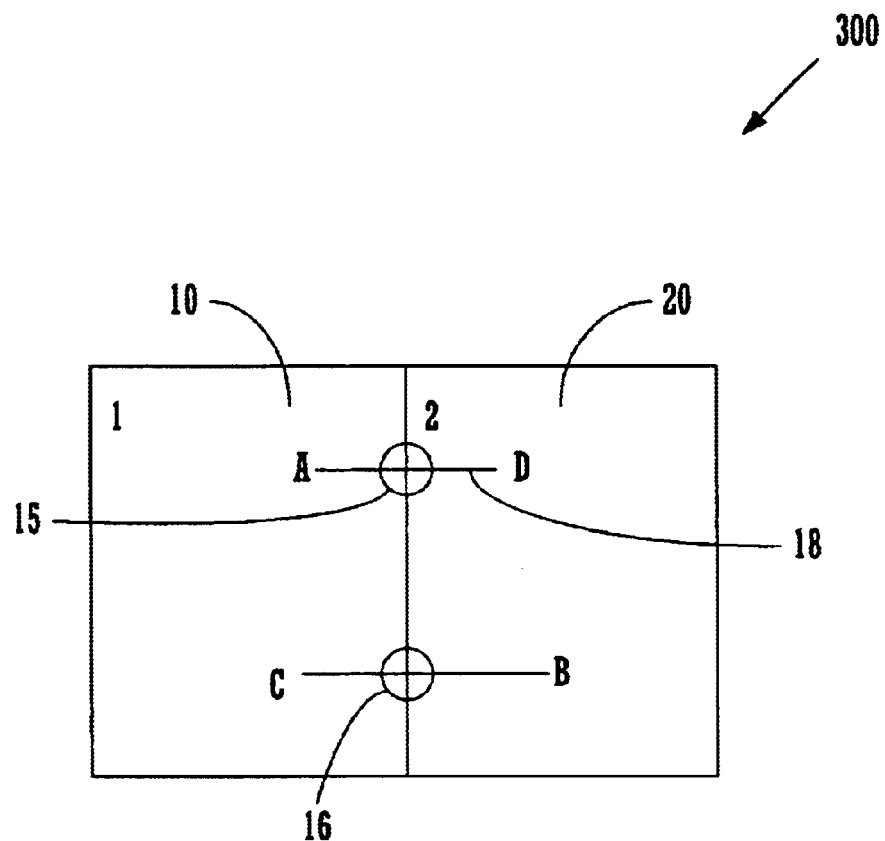
FIG. 11A illustrates an integrated circuit 300 based on the abutted-pin hierarchical physical design process of the present invention and using the integrated circuit design flow of the present invention (FIG. 9B), showing the top-level routing for pin assignment.

FIG. 11A illustrates an integrated circuit 300 based on the abutted-pin hierarchical physical design process of the present invention and using the integrated circuit design flow of the present invention (FIG. 9B), showing the top-level routing for pin assignment. The port C of block1 10 is routed to port B of block2 20. The port A of block1 10 is routed to port D of block2 20. This top-level routing has been performed after each port A–D where placed in a particular location within each block 10–20 at the top-level, whereas the particular location was based on using the physical design information associated with the prior integrated circuit (FIGS. 10A–10C). Here, the software tools at the top-level have access to the physical design information of the prior integrated circuit (FIGS. 10A–10C). The locations 15 and 16 are where the routing metal 18 crosses the boundary between two blocks 10 and 20.

Figure 11B:
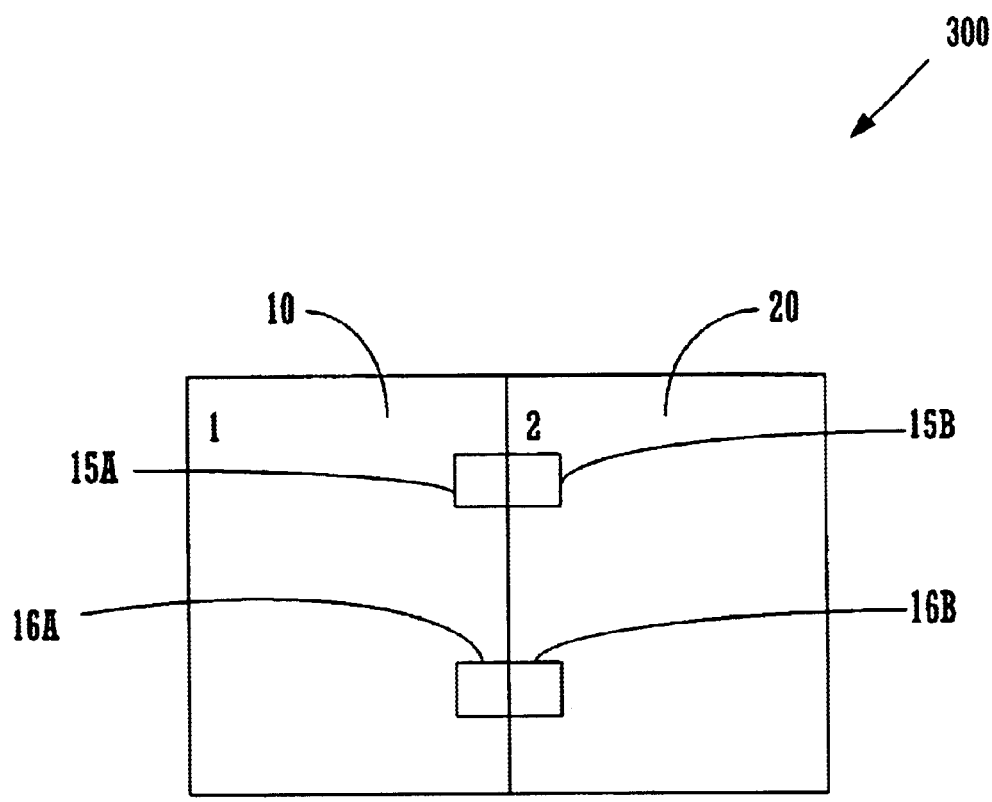
FIG. 11B illustrates the integrated circuit 300 of FIG. 11A at the block-level.

FIG. 11B illustrates the integrated circuit 300 of FIG. 11A at the block-level. At the block-level, the pins 15A and 16A were formed for block1 10. At the block-level, the pins 15B and 16B were formed for block2 20, whereas pin 15A abuts pin 15B and pin 16A abuts pin 16B. The pins 15A and 15B were formed at location 15 of FIG. 1A. The pins 16A and 16B were formed at location 16 of FIG. 11A. Here, the pins 15A and 15B are associated with ports A and D, unlike FIG. 10B where pins 15A and 15B were associated with ports C and B. Moreover, the pins 16A and 16B of FIG. 11B are associated with ports C and B, unlike FIG. 10B where pins 16A and 16B were associated with ports A and D.

Figure 11C:
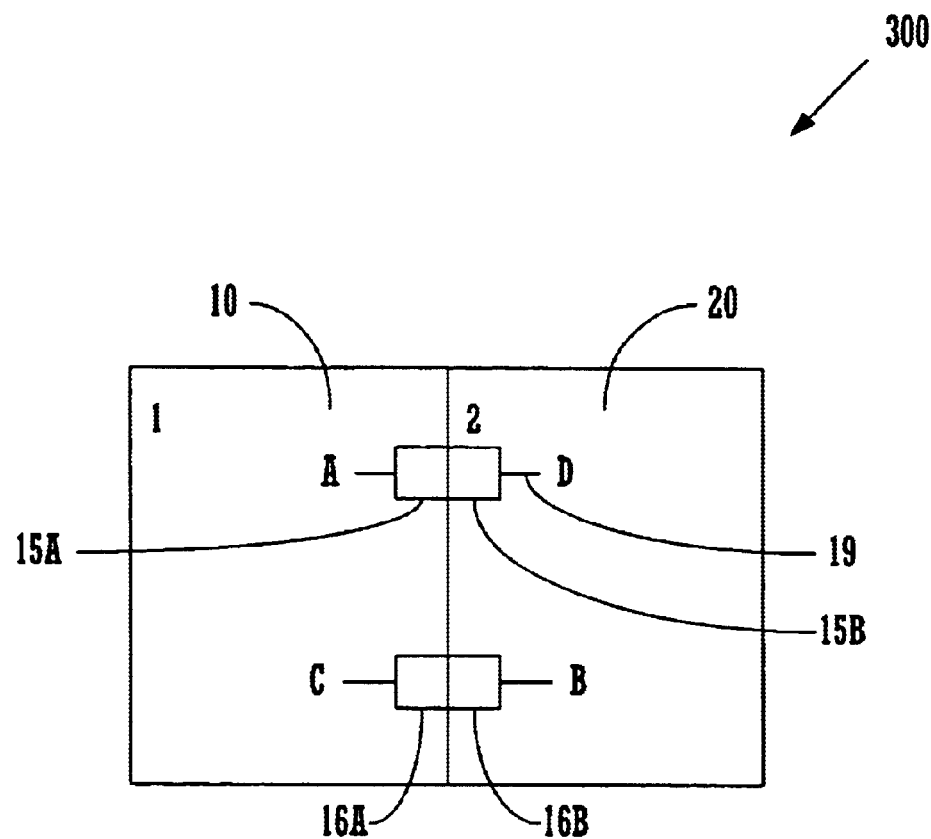
FIG. 11C illustrates the integrated circuit 300 of FIG. 11B at the block-level.

FIG. 11C illustrates the integrated circuit 300 of FIG. 11B at the block-level. As illustrated in FIG. 11C, the block-level placement operation for block1 10 placed the ports A and C at locations that are different from the locations used to generate the pin assignments in FIG. 11A. In addition, the block-level placement operation for block2 20 placed the ports B and D at locations that are different from the locations used to generate the pin assignments in FIG. 11A. However, the difference in the location of the ports between FIG. 11A and FIG. 11C is less than the difference in the location of the ports between FIG. 10A and FIG. 10C. Hence, the block-level routing operations for blocks 10 and 20 generated a more efficient amount of routing wire 19 to couple the ports to the pins in each block, compared to FIG. 10C. In sum, the pin assignments generated with the use of the physical design information of the prior integrated circuit (FIGS. 10A–10C) were more optimal than the pin assignments generated without the use of the physical design information of the prior integrated circuit (FIGS. 10A–10C).

Figure 12A:
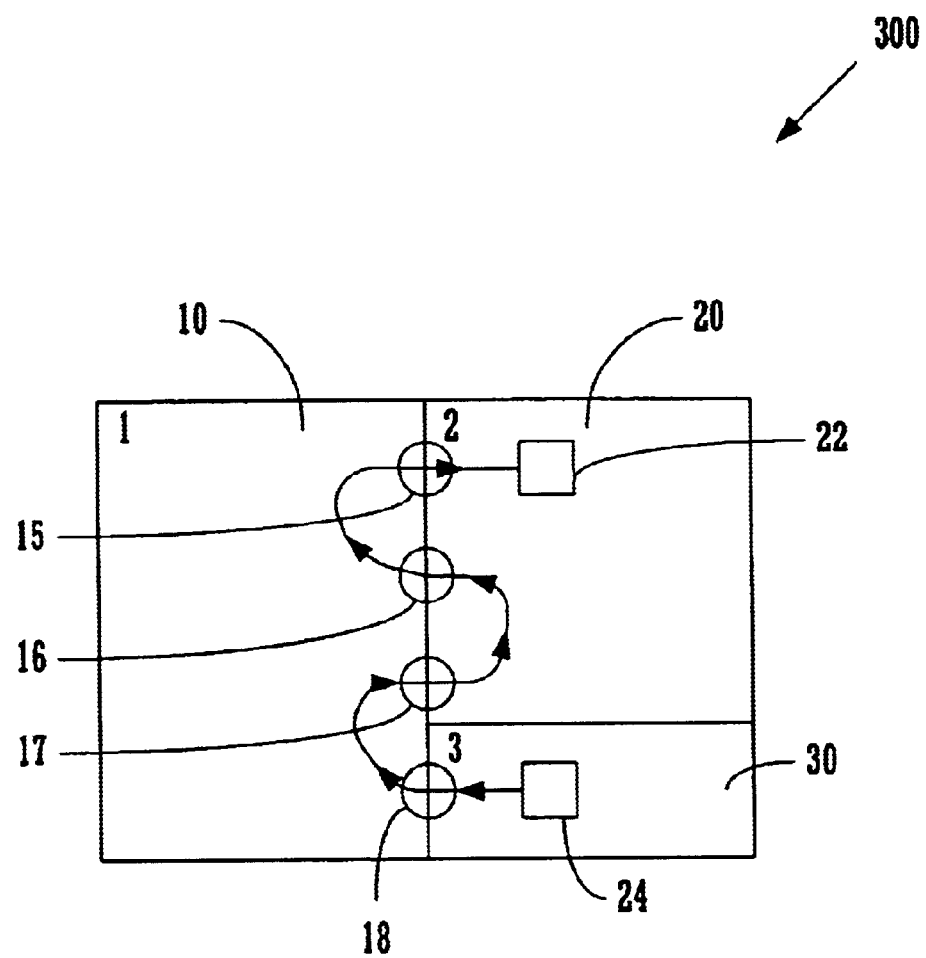
FIG. 12A illustrates an integrated circuit 300 based on the abutted-pin hierarchical physical design process of the present invention, showing the top-level routing for pin assignment.

FIG. 12A illustrates an integrated circuit 300 based on the abutted-pin a hierarchical physical design process of the present invention, showing the top-level routing for pin assignment. In the course of routing source port 24 of block3 30 to destination port 22 of block2 20, the software tool that performs the top-level routing for pin assignment crosses the boundary between block1 10 and block2 20 at locations 15,16, and 17, whereas the locations 15,16, and 17 will be defined as pins. The software tool is concerned with routing a path between the source port 24 and the destination port 22, but is not concerned about the number of times the path crosses the boundary between the same blocks.

Figure 12B:
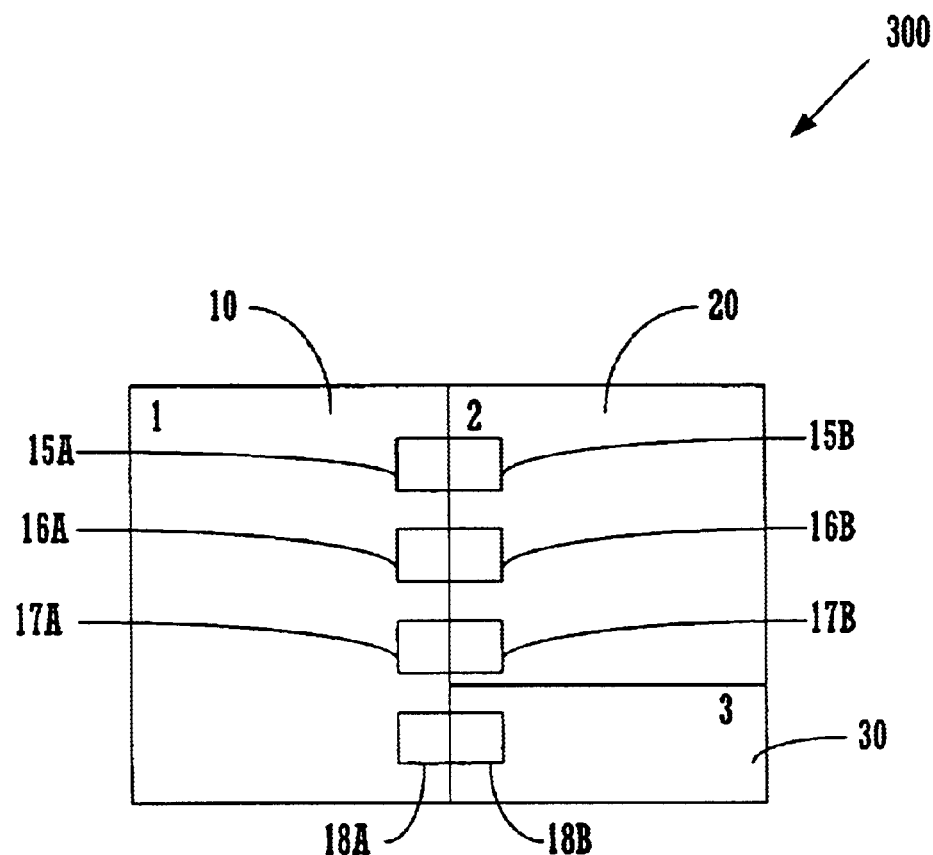
FIG. 12B illustrates the integrated circuit 300 of FIG. 12A at the block-level.

FIG. 12B illustrates the integrated circuit 300 of FIG. 12A at the block-level. The pins 15A–15B, 16A–16B, and 17A–17B are formed between block1 10 and block2 20. The pins 18A–18B are formed between block1 10 and block3 30. The presence of pins 16A–16B and 17A–17B causes additional routing metal to be added to block1 10 and block2 20 so that pins 15A, 16A, and 17A can be coupled within block1 10 and so that pins 15B, 16B, and 17B can be coupled within block2 20. Hence, one pair of pins (15A–15B or 16A–16B or 17A–17B) is sufficient.

Figure 12C:
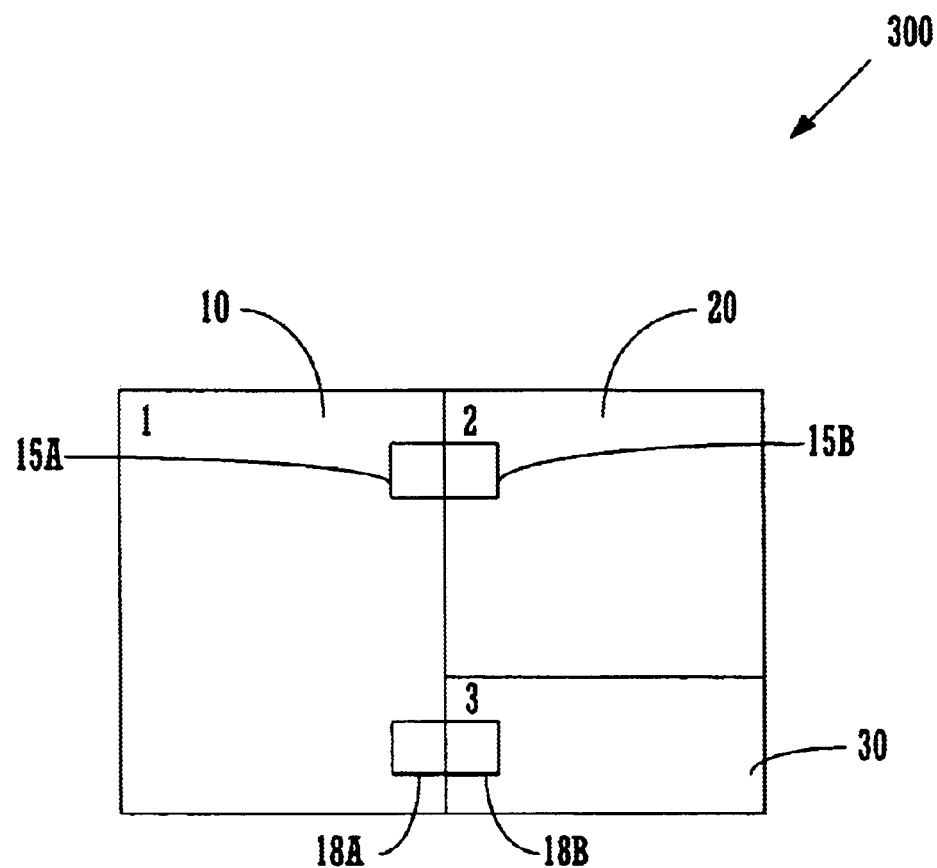
FIG. 12C illustrates the integrated circuit 300 of FIG. 12B, showing the removal of excess pins.

FIG. 12C illustrates the integrated circuit 300 of FIG. 12B, showing the removal of excess pins. As illustrated in FIG. 12O, excess pins 16A–16B and 17A–17B were removed from block1 10 and block2 20. This removal is based on a plurality of criteria, such as the current flow direction between the source port 24 and the destination port 22, the location of the excess pins relative to the source port 24 and the destination port 22, or any other criteria. Here, the criteria kept pins 15A–15B but deleted pins 16A–16B and 17A–17B.

Figure 13A:
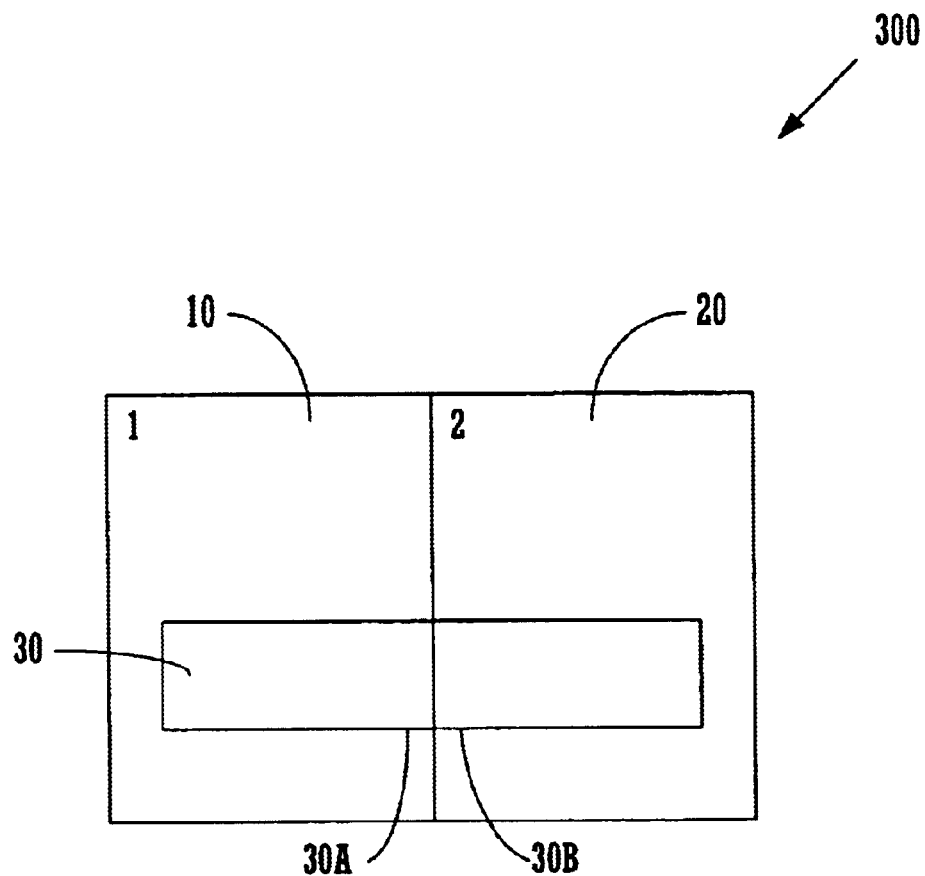
FIG. 13A illustrates an integrated circuit 300 based on the abutted-pin hierarchical physical design process of the present invention, showing the top-level routing for a top-level object 30 (e.g., routing metal).
Figure 13B:
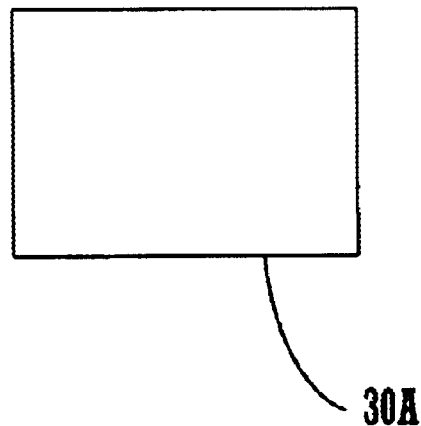
FIG. 13B illustrates the segment 30A of FIG. 13A.

FIG. 13A illustrates an integrated circuit 300 based on the abutted-pin hierarchical physical design process of the present invention, showing the top-level routing for a top-level object 30 (e.g., routing metal). As described above, a software tool performs a press operation so that the portion of the top-level object 30 which is within the boundary of a particular block 10–20 is moved from the top-level netlist to the block-level netlist of the particular block 10–20. In particular, the segment 30A is pressed into block1 10 while the segment 30B is pressed into block2 20. In an embodiment, the shape operations of a database are utilized in performing the press operation. In FIG. 13A, an AND operation would be performed with block1 10 and the shape 30 to obtain the segment 30A (FIG. 13B). Typically, the routing metal 30 includes a plurality of properties that are stored in a database. These properties identify the routing metal 30 and describe the function of the routing metal 30. However, in the shape operations (e.g., AND) of the prior art, the shape operation returns the segment 30A (FIG. 13B) without its properties. Thus, these properties have to be reconstructed.

In the present invention, the software tool t hat performs the press operation preserves the properties associated with segment 30A of the routing metal 30 despite the shape operation (e.g., AND) performed with block1 10 and the shape 30 to obtain the segment 30A (FIG. 13B).

Figure 13C:
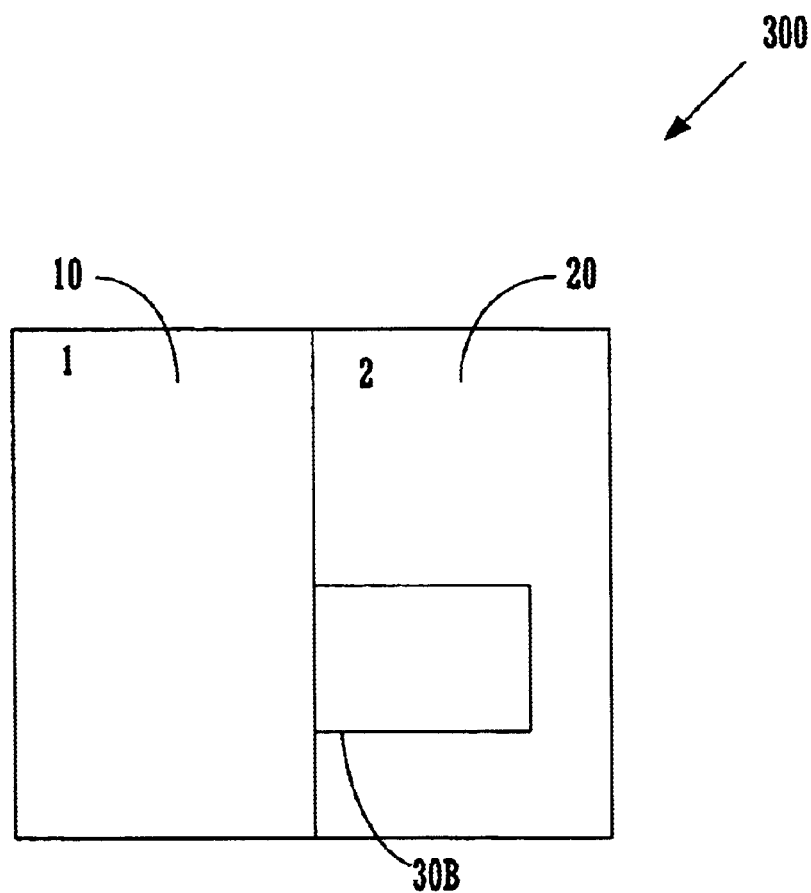
FIG. 13C illustrates the integrated circuit 300 of FIG. 13A in the top-level, showing that the segment 30A has been removed from the top-level netlist and merged into the block-level netlist of block1 10.

FIG. 13C illustrates the integrated circuit 300 of FIG. 13A in the top-level, showing that the segment 30A has been removed from the top-level netlist and merged into the block-level netlist of block1 10. Moreover, the properties associated with segment 30A at the top level are transferred to the segment 30A at the block-level.

Figure 14A:
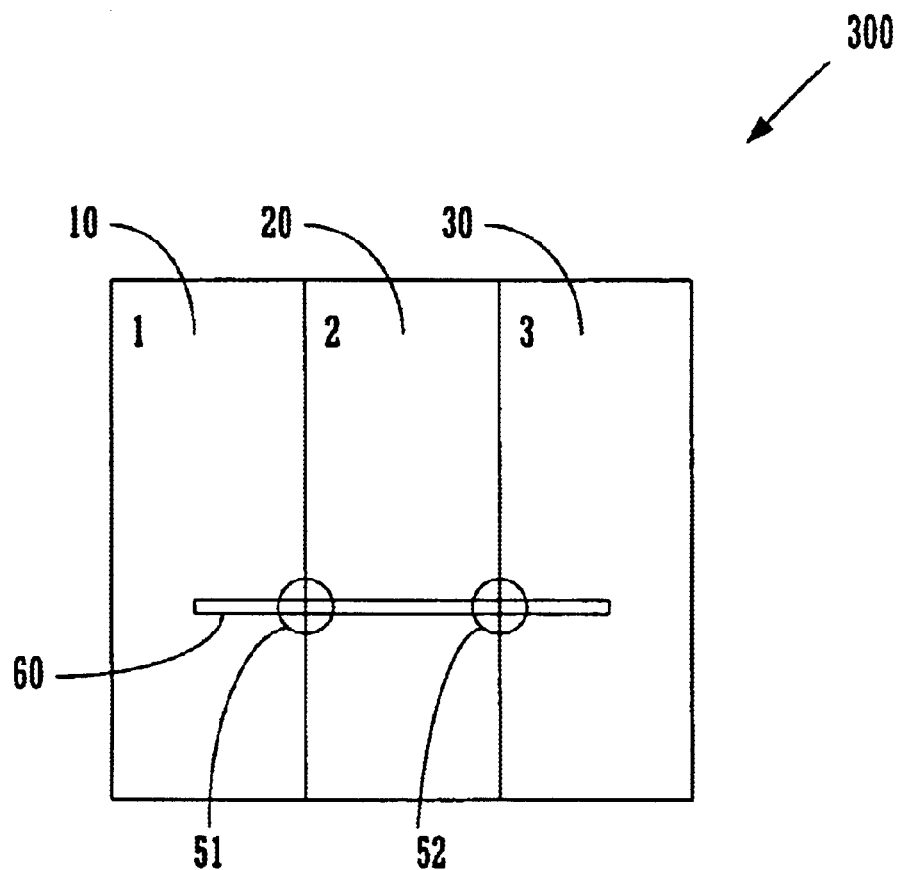
FIG. 14A illustrates an integrated circuit 300 based on the abutted-pin hierarchical physical design process of the present invention, showing the top-level routing for a top-level object 60 (e.g., routing metal).
Figure 14B:
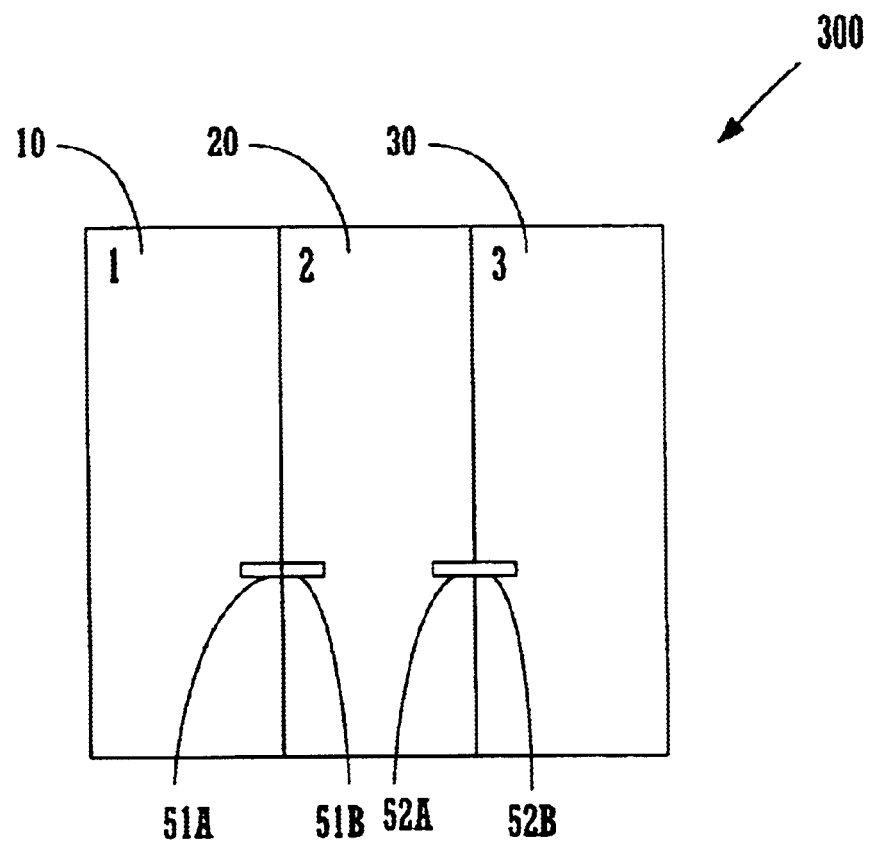
FIG. 14B illustrates the integrated circuit 300 at the block-level.
Figure 14C:
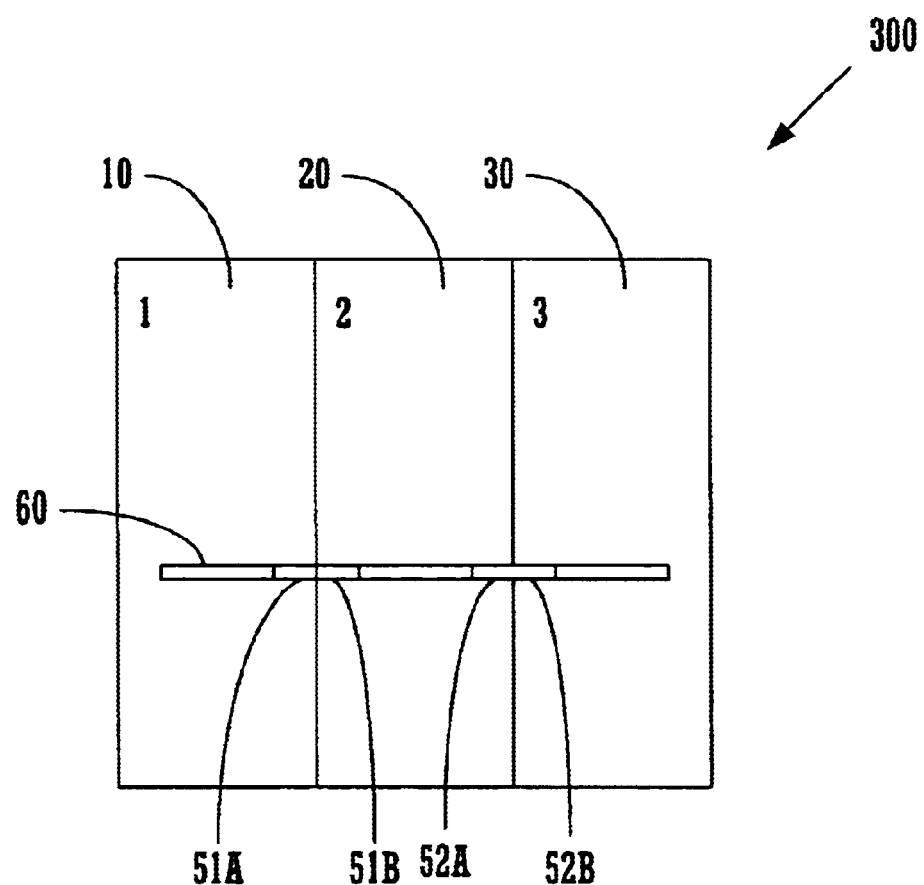
FIG. 14C illustrates the integrated circuit 300 at the block-level.
Figure 15A:
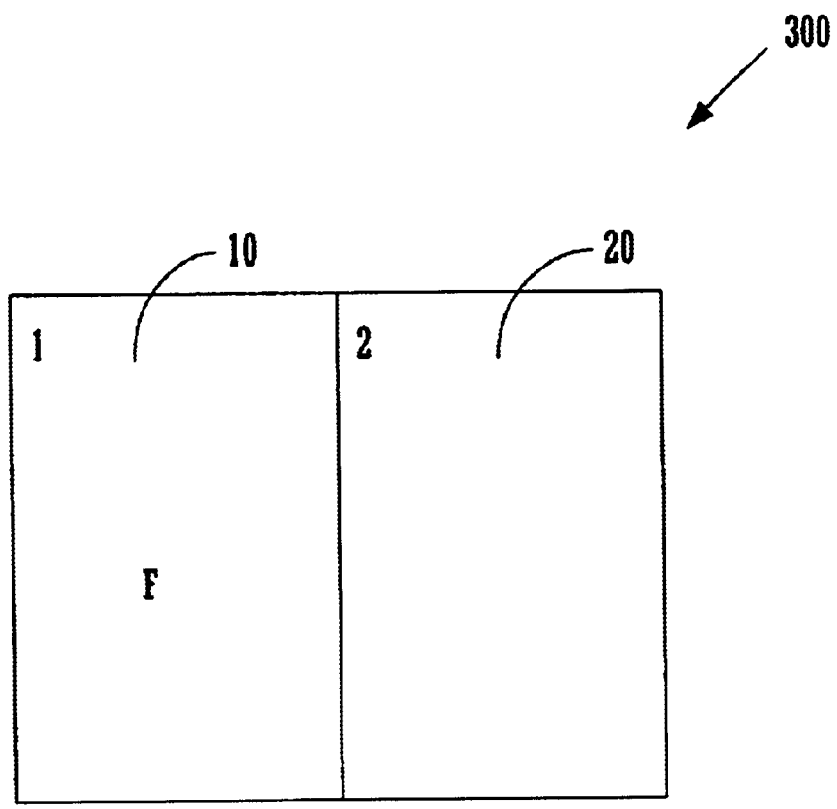
FIG. 15A illustrates an integrated circuit 300 based on the abutted-pin hierarchical physical design process of the present invention, showing the top-level routing for pin assignment.
Figure 15B:
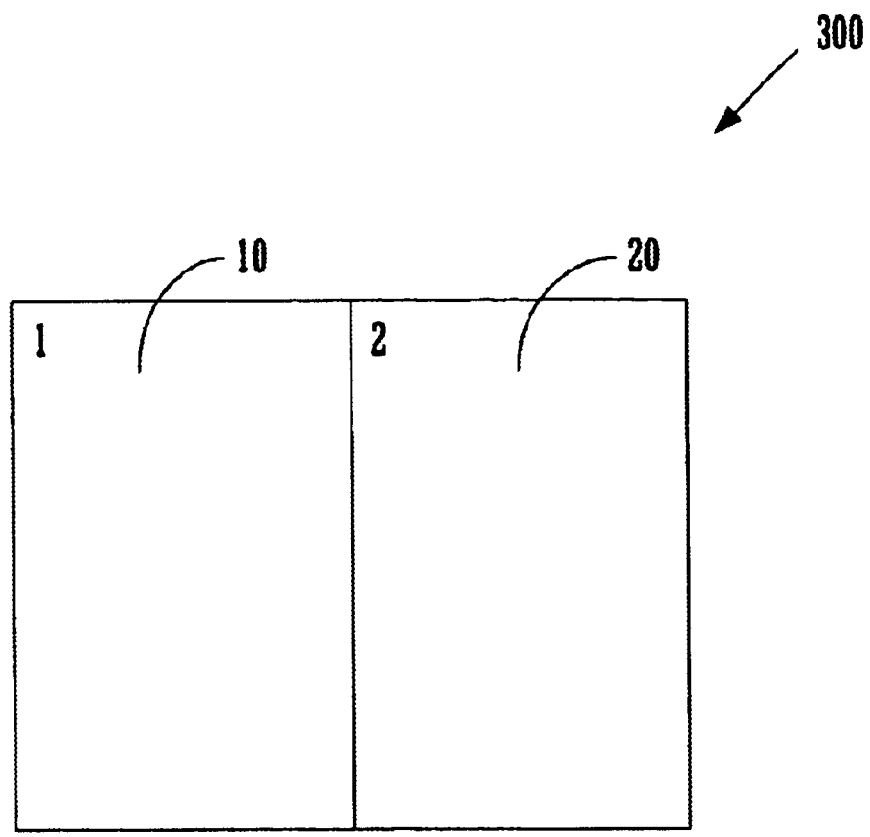
FIG. 15B illustrates that the port F of block1 10 has been removed from the top-level netlist.

FIG. 14A illustrates an integrated circuit 300 based on the abutted-pin hierarchical physical design process of the present invention, showing the top-level routing for a top-level object 60 (e.g., routing metal). As illustrated in FIG. 14A, the top-level object 60 is routed through block1 10, block2 20, and block3 30. The locations 51–52 indicate top-level object 60 crosses a boundary between two blocks. In an embodiment, a press property is added to the properties of the top-level object 60 stored in a database. If the top-level object 60 has the press property, the top-level object 60 retains its location when the top-level object 60 is pressed into block1 10, block 20, and block3 30, as illustrated in the block-level view of the integrated circuit 300 in FIG. 14C. If the top-level object 60 does not have the press property, the top-level object 60 generally does not retain its location when the top-level object 60 is pressed into block1 10, block2 20, and block3 30, as illustrated in the block-level view of the integrated circuit 300 in FIG. 14B. For example, top-level objects such as power and ground have the press property. As illustrated in FIG. 14B, the pins 51A–51B and 52A–52B are defined. However, the software tool is not constrained to placing the top-level object 60 in the block-level exactly as it was placed at the top-level. Moreover, the top-level object is placed in the block-level of block1 10, block2 20, and block3 30 according to the separate placement and routing requirements of block1 10, block2 20, and block3 30. –FIG. 15A illustrates an integrated circuit 300 based on the abutted-pin hierarchical physical design process of the present invention, showing the top-level routing for pin assignment. As illustrated in FIG. 15A, in the top-level netlist, the instantiation of block1 10 includes port F that is unused, thus, not needed for the top-level outing for pin assignment. Hence, a software tool removes port F from the top-level netlist, but the block-level netlist of block1 10 remains unchanged. In an embodiment, the software tool that performs the press operation removes the port F. FIG. 15B illustrates that the port F of block1 10 has been removed from the top-level netlist.

Figure 16A:
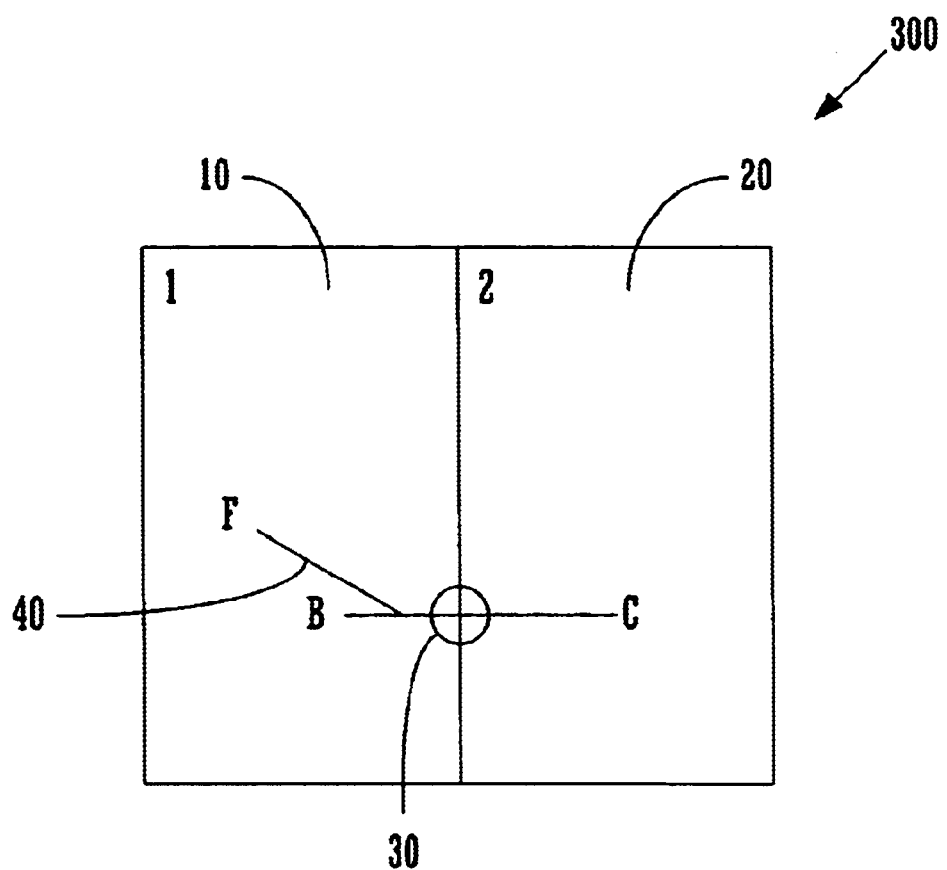
FIG. 16A illustrates an integrated circuit 300 based on the abutted-pin hierarchical physical design process of the present invention, showing the top-level routing for pin assignment.
Figure 16B:
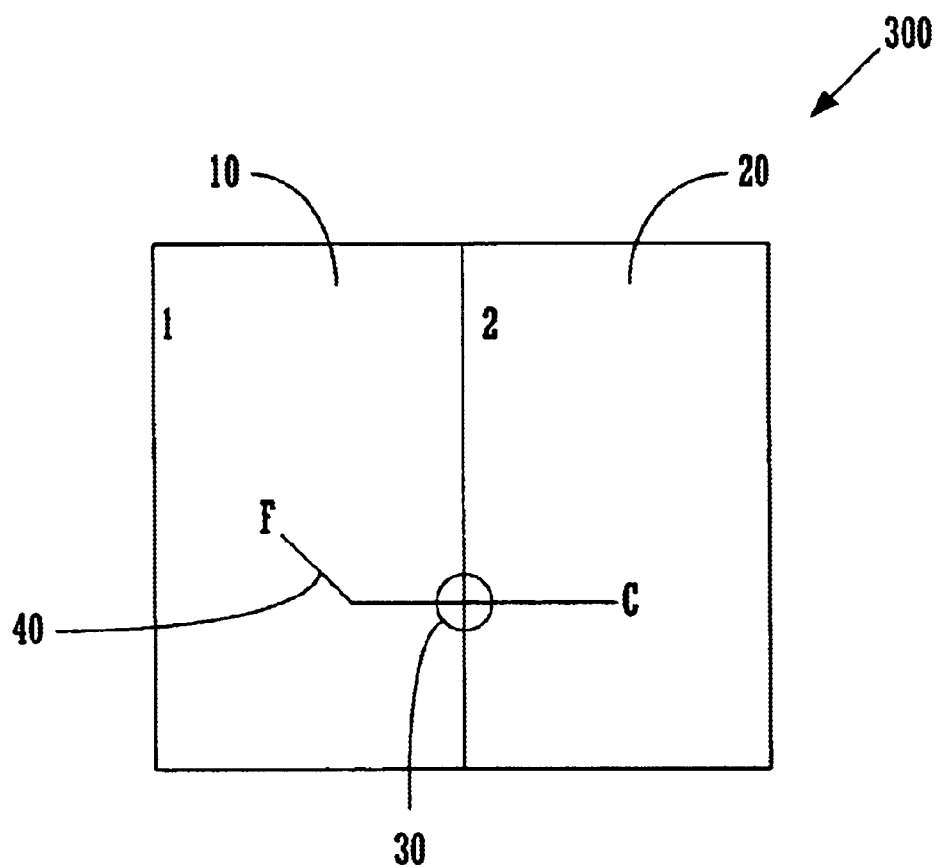
FIG. 16B illustrates that the port B of block1 10 has been removed from the netlist for the top-level routing for pin assignment.

FIG. 16A illustrates an integrated circuit 300 based on the abutted-pin hierarchical physical design process of the present invention, showing the top-level routing for pin assignment. As illustrated in FIG. 16A, port F and port B of block1 10 are coupled to port C of block2 20 with a routing metal 40. However, at location 30 the routing metal 40 crosses the boundary between block1 10 and block2 20. If a pin is formed within block1 10 at location 30, the pin would be coupled to port F and to port B. However, some software tools are not able to represent this relationship (i.e., more than one port coupled to a pin). Hence, a software tool removes one of the ports (port F or port B) from the netlist based on some criteria, such as whether a port is an input port or an output port. FIG. 16B illustrates that the port B of block1 10 has been removed from the netlist for the top-level routing for pin assignment.

Figure 17A:
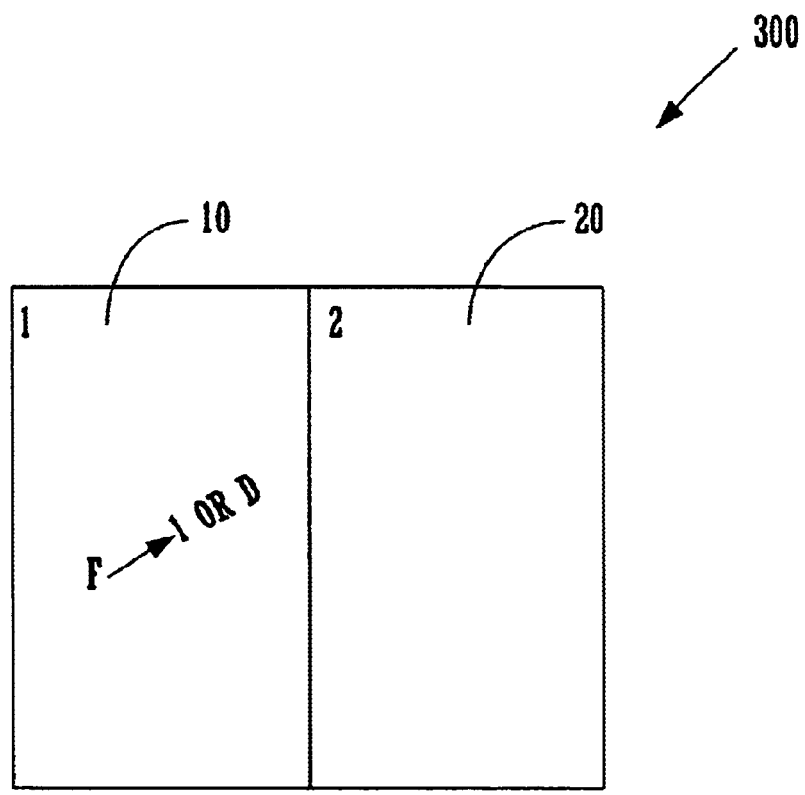
FIG. 17A illustrates an integrated circuit 300 based on the abutted-pin hierarchical physical design process of the present invention, showing the top-level routing for pin assignment.
Figure 17B:
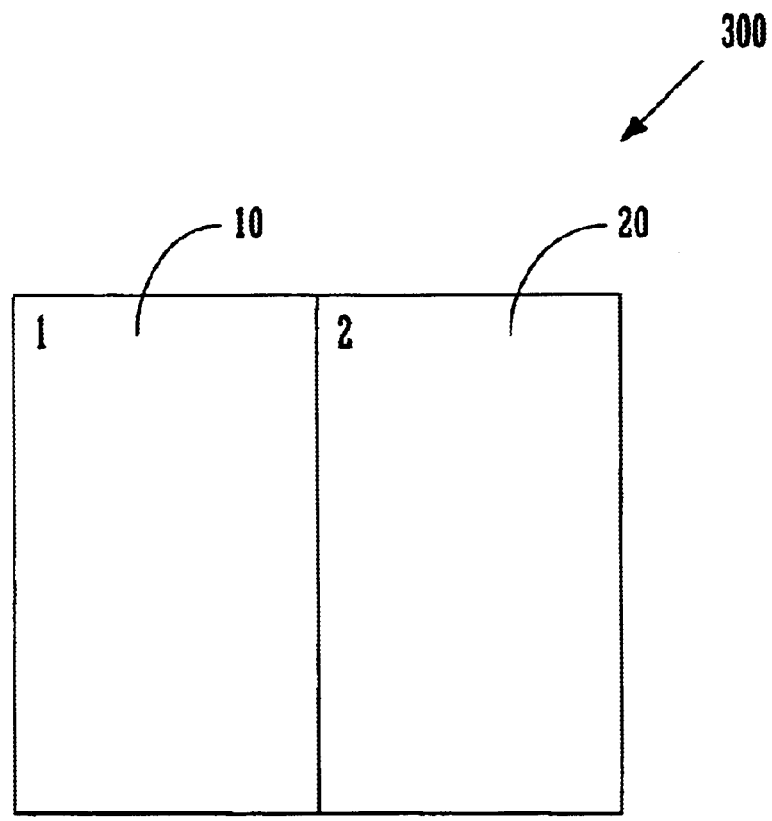
FIG. 17B illustrates that the port F of block1 10 has been removed from the top-level netlist.

FIG. 17A illustrates an integrated circuit 300 based on the abutted-pin hierarchical physical design process of the present invention, showing the top-level routing for pin assignment. As illustrated in FIG. 17A, in the top-level netlist, the instantiation of block1 10 includes a port F that is tied to either the power line (1) or the ground line (0) rather to a port of another block. Hence, a software tool removes port F from the top-level netlist to avoid routing the port F at the top-level. Moreover, the software tool ties the port F to either power line (1) or the ground line (0) in the block-level netlist of block1 10. FIG. 17B illustrates that the port F of block1 10 has been removed from the top-level netlist.

As illustrated in FIG. 3, the integrated circuit 300 based on the abutted-pin hierarchical physical design process of the present invention includes a North bond pad block 60, an East bond pad block 70, a South bond pad block 80, and a West bond pad block 90, each having bond pad cells. The top-level netlist of the integrated circuit 300 includes one or more top-level inputs for receiving external signals and one or more top-level outputs for transmitting signals off the chip. The top-level inputs and the top-level outputs are coupled to bond pad cells. Typically, software tools which perform a routing operation are configured to not perform the routing operation if the netlist includes bond pad cells.

Since the North bond pad block 60, the East bond pad block 70, the South bond pad block 80, and the West bond pad block 90 have bond pad cells in the block-level netlist, the software tools refuse to perform the routing operation in these blocks, preventing pins to be formed on the boundary between these blocks and the blocks 10–30 (the core blocks).

In the present invention, the bond pad cells are marked as macrocells rather than bond pad cells, allowing pins to be formed on the boundary between these blocks 60, 70, 80, and 90 and the blocks 10–30 (the core blocks).

Typically, the block-level netlist of the North bond pad block 60, the East bond pad block 70, the South bond pad block 80, and the West bond pad block 90 include nets to the top-level inputs and nets to the top-level outputs. Generally, the block-level netlist of the North bond pad block 60, the East bond pad block 70, the South bond pad block 80, and the West bond pad block 90 include nets to the bond pad cells.

In an embodiment of the present invention, a software tool removes the nets to the top-level inputs and nets to the top-level outputs so that the physical design of the integrated circuit can be accomplished as described above. In an embodiment, the software tool removes in the block-level netlist the ports that couple to the top-level inputs and to the top-level outputs. Moreover, the software tool adds a property to the nets to the bond pad cells to indicate that these nets are suppose to couple to the top-level inputs and to the top-level outputs, facilitating an unwinding operation to re-establish at the block-level netlist the nets to the top-level inputs and nets to the top-level outputs that were removed earlier. The un winding operation adds to the block-level netlist the ports (which were removed earlier) that couple to the top-level inputs and to the top-level outputs. Thus, the netlist modified by the physical design phase (e.g., repeater and buffers are added to the netlist) can be compared with the netlist originally received from the logic design phase. In particular, formal verification, layout versus schematic (LVS) verification, and design rules check (DRC) verification can be performed by software tools.

A challenge with implementing an integrated circuit based on the abutted-pin hierarchical physical design process of the present invention involves analyzing the timing of signal paths that traverse more than one block. The timing of these global paths is difficult to analyzed compared to analyzing the timing of local paths, whereas local paths are signal paths that do not leave a block. One method of analyzing the timing of these global paths involves partitioning the block-level netlist of each block into a first netlist and a second netlist. The first netlist includes nets which start at a register (or flip-flop) and end at a register (or flip-flop) within the block, whereas each branch of the net also starts at a register (or flip-flop) and ends at a register (or flip-flop) within the block. The second netlist includes nets which are coupled to a pin of the block. Generally, the first netlist is ¾ of the initial block-level netlist while the second netlist is ¼ of the initial block-level netlist. If the second netlist ratio is greater than ¼, this indicates inefficient partitioning of the blocks.

Once the first netlist and the second netlist are obtain, an extraction operation to obtain parasitic resistance and capacitance is performed on the second netlist of each block. In an embodiment, the partitioning of the block-level netlist and the extraction operation in each block are performed in parallel. Moreover, an extraction operation is performed on the top-level netlist. In an embodiment, a software tool replaces the abutted pins of the top-level netlist with zero ohm resistors.

Some software tools utilized to perform the timing analysis are unable to operate on netlists having nets that are coupled to multiple pins of a block. In an embodiment of the present invention, these netlist are transformed by using "assign statements" to assign different names to the nets that are coupled to multiple pins of a block. Hence, each different named net can be coupled to a separate pin of the block.

In an embodiment, the second netlist and its associated extraction file of each block and the top-level netlist and its associated extraction file are utilized by software tools to perform the timing analysis. This timing analysis can be performed significantly faster than the case where the block-level netlist is not partitioned into the first netlist and the second netlist. In an embodiment, the timing graph resulting from the timing analysis can be analyzed to extract timing constraints (relating to the delay that can be generated by a block) for each block. Hence, if a block is optimized to meet its extracted timing constrains, the block is more likely to meet its timing parameter when the block interacts with the other blocks in the integrated circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of improving a physical design of a current integrated circuit, comprising the steps of:
    a) receiving a netlist of said current integrated circuit;
    b) receiving physical design information from a prior integrated circuit; and
    c) generating said physical design based on said netlist and said physical design information.

2. A method as recited in claim 1 wherein said physical design information includes pin assignments of blocks of said prior integrated circuit.

3. A method as recited in claim 1 wherein said physical design information includes optimal clock distribution tree of said prior integrated circuit.

4. A method as recited in claim 1 wherein said physical design information includes parasitic extraction data of said prior integrated circuit.

5. A method as recited in claim 1 wherein said physical design information includes identification of congested blocks of said prior integrated circuit.

6. A method as recited in claim 1 wherein said physical design information includes metal resources of said prior integrated circuit.

7. A method as recited in claim 1 wherein said physical design information includes information which facilitates optimizing said current integrated circuit.

8. A method as recited in claim 1 wherein said step c) includes:
    generating a top-level physical design of said current integrated circuit using said netlist and said physical design information including block-level physical design information of said prior integrated circuit.

9. A method as recited in claim 1 wherein said step c) includes:

generating a block-level physical design of said current integrated circuit using said netlist and said physical design information including block-level physical design information of said prior integrated circuit.

10. A method as recited in claim 1 wherein said physical design is an abutted-pin hierarchical physical design including a top-level physical design and a block-level physical design.

11. A method as recited in claim 1 wherein said physical design information includes locations of obstructions of said prior integrated circuit.

12. A method as recited in claim 11 wherein said obstructions include a random access memory (RAM).

13. A method as recited in claim 1 wherein said step c) includes:
    partitioning said netlist into a plurality of blocks, each block including a block-level netlist;
    performing a top-level floor planning;
    performing a top-level placement and route for a plurality of top-level objects;
    performing a top-level placement and route for a plurality of ports from said blocks to determine pin assignments for each block; and
    generating and optimizing a block-level physical design for each block in parallel.

14. A method as recited in claim 13 wherein said generating and optimizing includes:
    pressing each portion of each top-level object, which is located within a boundary of a particular block, into said particular block;
    generating each pin for each block based on said top-level placement and route to determine pin assignments;
    performing a block-level floor planning for each block;
    performing a block-level placement for each block;
    performing a plurality of block-level operations to optimize each block; and
    performing a block-level route for each block.

15. A computer-readable medium comprising computer-executable instructions stored therein for performing a method of improving a physical design of a current integrated circuit, said method comprising:
    a) receiving a netlist of said current integrated circuit;
    b) receiving physical design information from a prior integrated circuit; and;
    c) generating said physical design based on said netlist and said physical design information.

16. A computer-readable medium as recited in claim 15 wherein said physical design information includes pin assignments of blocks of said prior integrated circuit.

17. A computer-readable medium as recited in claim 15 wherein said physical design information includes optimal clock distribution tree of said prior integrated circuit.

18. A computer-readable medium as recited in claim 15 wherein said physical design information includes parasitic extraction data of said prior integrated circuit.

19. A computer-readable medium as recited in claim 15 wherein said physical design information includes identification of congested blocks of said prior integrated circuit.

20. A computer-readable medium as recited in claim 15 wherein said physical design information includes metal resources of said prior integrated circuit.

21. A computer-readable medium as recited in claim 15 wherein said physical design information includes information which facilitates optimizing said current integrated circuit.

22. A computer-readable medium as recited in claim 15 wherein said step c) includes:
    generating a top-level physical design of said current integrated circuit using said netlist and said physical design information including block-level physical design information of said prior integrated circuit.

23. A computer-readable medium as recited in claim 15 wherein said step c) includes:
    generating a block-level physical design of said current integrated circuit using said netlist and said physical design information including block-level physical design information of said prior integrated circuit.

24. A computer-readable medium as recited in claim 15 wherein said physical design is an abutted-pin hierarchical physical design including a top-level physical design and a block-level physical design.

25. A computer-readable medium as recited in claim 15 wherein said physical design information includes locations of obstructions of said prior integrated circuit.

26. A computer-readable medium as recited in claim 25 wherein said obstructions include a random access memory (RAM).

27. A computer-readable medium as recited in claim 15 wherein said step c) includes:
    partitioning said netlist into a plurality of blocks, each block including a block-level netlist;
    performing a top-level floor planning;
    performing a top-level placement and route for a plurality of top-level objects;
    performing a top-level placement and route for a plurality of ports from said blocks to determine pin assignments for each block; and
    generating and optimizing a block-level physical design for each block in parallel.

28. A computer-readable medium as recited in claim 27 wherein said generating and optimizing includes:
    pressing each portion of each top-level object, which is located within a boundary of a particular block, into said particular block;
    generating each pin for each block based on said top-level placement and route to determine pin assignments;
    performing a block-level floor planning for each block;
    performing a block-level placement for each block;
    performing a plurality of block-level operations to optimize each block; and
    performing a block-level route for each block.

29. A method of determining a plurality of pins for each block of a physical design of a current integrated circuit, comprising:
    a) receiving a netlist of said current integrated circuit;
    b) receiving physical design information from a prior integrated circuit, wherein said physical design information includes pin assignments of blocks of said prior integrated circuit;
    c) using said netlist and said physical design information to perform a top-level placement for a plurality of ports corresponding to each block of said current integrated circuit;
    d) using said netlist and said physical design information to perform a top-level route for said ports to determine pin assignments for each block of said current integrated circuit; and
    e) generating each pin for each block based on said top-level route to determine pin assignments.

30. A method as recited in claim 29 further comprising:
partitioning said netlist into a plurality of blocks of said current integrated circuit, each block including a block-level netlist.

31. A method as recited in claim 29 wherein said physical design information includes optimal clock distribution tree of said prior integrated circuit.

32. A method as recited in claim 29 wherein said physical design information includes parasitic extraction data of said prior integrated circuit.

33. A method as recited in claim 29 wherein said physical design information includes identification of congested blocks of said prior integrated circuit.

34. A method as recited in claim 29 wherein said physical design information includes metal resources of said prior integrated circuit.

35. A method as recited in claim 29 wherein said physical design information includes information which facilitates optimizing said current integrated circuit.

36. A method as recited in claim 29 wherein said physical design information includes locations of obstructions of said prior integrated circuit.

37. A method as recited in claim 36 wherein said obstructions include a random access memory (RAM).

38. A method as recited in claim 29 wherein said physical design is an abutted-pin hierarchical physical design.

39. A method as recited in claim 38 wherein said physical design includes a top-level physical design.

40. A method as recited in claim 38 wherein said physical design includes a block-level physical design.

41. A computer-readable medium comprising computer-executable instructions stored therein for performing a method of determining a plurality of pins for each block of a physical design of a current integrated circuit, comprising:
   a) receiving a netlist of said current integrated circuit;
   b) receiving physical design information from a prior integrated circuit, wherein said physical design information includes pin assignments of blocks of said prior integrated circuit;
   c) using said netlist and said physical design information to perform a top-level placement for a plurality of ports corresponding to each block of said current integrated circuit;
   d) using said netlist and said physical design information to perform a top-level route for said ports to determine pin assignments for each block of said current integrated circuit; and
   e) generating each pin for each block based on said top-level route to determine pin assignments.

42. A computer-readable medium as recited in claim 41 wherein said method further comprises:
partitioning said netlist into a plurality of blocks of said current integrated circuit, each block including a block-level netlist.

43. A computer-readable medium as recited in claim 41 wherein said physical design information includes optimal clock distribution tree of said prior integrated circuit.

44. A computer-readable medium as recited in claim 41 wherein said physical design information includes parasitic extraction data of said prior integrated circuit.

45. A computer-readable medium as recited in claim 41 wherein said physical design information includes identification of congested blocks of said prior integrated circuit.

46. A computer-readable medium as recited in claim 41 wherein said physical design information includes metal resources of said prior integrated circuit.

47. A computer-readable medium as recited in claim 41 wherein said physical design information includes information which facilitates optimizing said current integrated circuit.

48. A computer-readable medium as recited in claim 41 wherein said physical design information includes locations of obstructions of said prior integrated circuit.

49. A computer-readable medium as recited in claim 48 wherein said obstructions include a random access memory (RAM).

50. A computer-readable medium as recited in claim 41 wherein said physical design is an abutted-pin hierarchical physical design.

51. A computer-readable medium as recited in claim 50 wherein said physical design includes a top-level physical design.

52. A computer-readable medium as recited in claim 50 wherein said physical design includes a block-level physical design.

* * * * *